(12) United States Patent
Yoshida et al.

(10) Patent No.: US 6,644,832 B2
(45) Date of Patent: Nov. 11, 2003

(54) ILLUMINATION DEVICE AND MANUFACTURING METHOD THEREFOR, DISPLAY DEVICE, AND ELECTRONIC INSTRUMENT

(75) Inventors: Shohei Yoshida, Shimusuwa (JP); Hidehito Iisaka, Shiojiri (JP); Hidefumi Sakata, Tatsuno (JP); Tetsuhiko Takeuchi, Shimusuwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/021,003

(22) Filed: Dec. 19, 2001

(65) Prior Publication Data

US 2002/0122144 A1 Sep. 5, 2002

(30) Foreign Application Priority Data

Dec. 25, 2000 (JP) .......................... 2000-393717
Jan. 11, 2001 (JP) ....................... 2001-003508

(51) Int. Cl.⁷ .................................................. H01J 1/88
(52) U.S. Cl. ....................... 362/241; 362/561; 313/500; 313/498; 313/499
(58) Field of Search .................... 362/31, 561, 241, 362/551, 559, 560, 227, 235, 236, 237, 240, 800, 812; 313/500, 510, 512; 345/44, 82, 45, 46, 76

(56) References Cited

U.S. PATENT DOCUMENTS 4,115,994 A * 9/1978 Tomlinson .................. 368/241
4,330,877 A * 5/1982 Barnes ....................... 362/288
5,337,224 A * 8/1994 Field et al. .................. 313/509
5,375,043 A * 12/1994 Tokunaga ................... 362/561
6,106,127 A * 8/2000 Fuwausa .................... 368/227
6,231,201 B1 * 5/2001 Rupp ............................ 362/31
6,270,236 B1 * 8/2001 Brussog ...................... 362/555

FOREIGN PATENT DOCUMENTS

JP 6-102402 4/1994
JP 10-282497 10/1998

* cited by examiner

Primary Examiner—Alan Cariaso
Assistant Examiner—Ismael Negron
(74) Attorney, Agent, or Firm—Oliff & Berridge, PLC

(57) ABSTRACT

An illumination device is provided that reduces the amount of light leaked to improves illumination efficiency. Electroluminescent elements are formed on one surface of a transparent substrate. The electroluminescent elements are provided with at least a transparent electrode, a light emitting layer, and a reflective electrode in order from the outgoing surface of the transparent substrate. Concavities are formed on one surface of the transparent substrate and the reflective electrode is formed in the concavities. Alternatively, electroluminescent elements are arranged in a planar configuration, and the intervals between the electroluminescent elements and the intervals between the pixels are set so as not to be equal to each other. Also, the directions in which the electroluminescent elements extend and the directions in which the pixels are aligned are set so as not to be parallel to each other.

36 Claims, 16 Drawing Sheets

ILLUMINATION DEVICE AND MANUFACTURING METHOD THEREFOR, DISPLAY DEVICE, AND ELECTRONIC INSTRUMENT

BACKGROUND OF THE INVENTION

1. Field of the Invention

The present invention relates to an illumination device and a manufacturing method therefor, a display device, and an electronic instrument and, in particular, to an illumination device that is advantageous when formed as a front light placed on the viewing side of a display device, and to a display device whose viewing side is provided with this illumination device, as well as to an electronic instrument provided with this display device.

2. Description of the Related Art

Conventionally, a reflective type of liquid crystal display device (electro-optical device) is known in which exterior light such as sunlight shines into the viewing side of a liquid crystal display panel, is reflected inside the liquid crystal display panel, and is then transmitted to the viewer's side. However, because reflective type liquid crystal display devices are difficult to view in dark locations, a reflective type of liquid crystal display device provided with a front light (illumination device) on the viewer's side of the liquid crystal display panel has been proposed.

Broadly speaking, a conventional front light is constructed from a light source disposed on one edge of the viewing side of the liquid crystal display panel, and a light guide plate that is disposed on the viewing side of the liquid crystal display panel and that guides light from the light source toward the liquid crystal display panel.

However, the problem when using the above conventional front light is that a part of the light emitted from the light source does not travel towards the liquid crystal display panel, but instead travel from the surface of the light guide plate on the viewer's side directly towards the viewer (leakage light). As a result, the illumination efficiency is reduced and the leakage light causes the low contrast ratio of the liquid crystal display device leading to deterioration in the quality of the display.

SUMMARY OF THE INVENTION

The present invention was conceived in view of the above circumstances and it is an aim thereof to provide an illumination device that is capable of reducing the amount of light leaked that does not travel towards a display device but travels directly towards a viewer and that can thereby improve the illumination efficiency, and a manufacturing method for the illumination device, as well as a display device whose viewing side is provided with this illumination device, and an electronic instrument provided with this display device.

The illumination device of the present invention is provided with a transparent substrate having light emitting elements which are disposed on a surface thereof and which emit light, and the light emitting elements are provided with at least a transparent electrode, a light emitting layer, and a reflective electrode, in that order, from the outgoing surface of the transparent substrate.

That is, in the illumination device of the present invention, a reflective electrode functioning as a cathode electrode of the light emitting element reflects light emitted from the light emitting layer of a light emitting element, and then the reflected light travels towards a transparent electrode that functions as an anode electrode. As a result, light travels from one surface of a transparent substrate. Note that the illumination device of the present invention is provided on one side of the display device.

By employing a structure in which light that travels from the light emitting layer of a light emitting element is reflected by a reflective electrode and travels towards the opposite side of the reflective electrode in this way, when the illumination device of the present invention is provided in a display device, it is possible to reduce the amount of light leaked that does not travel towards the display device but travels from the illumination device directly towards the viewer. As a result, it is possible to obtain high contrast ratio. In addition, it is possible to illuminate efficiently towards the display device. As a result, the illumination efficiency is improved, and therefore power consumption can be reduced.

Furthermore, in the illumination device of the first aspect of the present invention, at least the reflective electrode of each light emitting element is formed in concavities that are formed having a pattern on one surface of the transparent substrate.

By forming at least the reflective electrode of each light emitting element inside the concavities that are formed on the transparent substrate, it is not necessary to perform a patterning process for at least the reflective electrodes of the light emitting elements. Accordingly, it is possible to simplify the patterning process.

It is also desirable that at least the reflective electrode and the light emitting layer of each light emitting element be formed in the concavities. By forming the light emitting layer inside the concavities in this way, the light emitting layer is wrapped with the transparent substrate, the reflective electrode, and the transparent electrode. Therefore, it is possible to prevent the light emitting layer from degradation. In particular, since the transparent substrate is made from a glass substrate or the like that has a low gas permeability, it is possible to prevent water vapor or the like from penetrating into the light emitting layer from the outside of the illumination device. Therefore, it is possible to prevent the light emitting layer from deteriorating.

Moreover, in the illumination device according to the first aspect of the present invention, it is desirable that the light emitting layer of the light emitting element consist of an organic electroluminescent material. Since the light emitting layer consists of an organic electroluminescent material that is capable of light emission at low voltages and that has a high level brightness, it is possible to reduce power consumption and to improve the illumination efficiency.

In the illumination device according to the first aspect of the present invention, it is also desirable that the concavities be formed on the outgoing surface of the transparent substrate; that the concavities have a concave curved bottom; and that at least the reflective electrode of each light emitting element be formed on the concave curved bottom of the concavities.

By forming concavities having a concave curved bottom on the outgoing surface of the transparent substrate and forming at least the reflective electrode of each light emitting element on the concave curved bottom of the concavities, it is possible to use the curved reflective electrode to condense the emitted light. Therefore, it is possible to reduce light leaking from the side of the light emitting elements and also to reduce the total reflected light within the transparent electrode and at the boundary between the transparent electrode and the light emitting layer.

Accordingly, the light emitting element can emit light more efficiently, and the illumination efficiency can be improved.

It is also desirable that a protective layer be provided over the surface of the transparent substrate on which the concavities are formed so as to protect the light emitting elements.

The illumination device according to the first aspect of the present invention may be manufactured using a method in which, after the concavities have been formed on one surface of the transparent substrate with a pattern, at least the reflective electrode of the light emitting elements can be formed in the concavities.

Moreover, the illumination device may be manufactured using a method in which the concavities having a concave curved bottom are formed on one surface of the transparent substrate by isotropically etching after forming the resist in the pattern.

Furthermore, it is desirable that the light emitting elements have a layer structure which the transparent electrode, the light emitting layer, and the reflective electrode are sequentially formed in the concavities on the surface of the transparent substrate. Because the light emitting elements are formed by stacking the transparent electrode, the light emitting layer, and the reflective electrode in layers in sequence inside the concavities, it is possible to simplify the patterning process for the transparent electrode, the light emitting layer, and the reflective electrode.

By providing the illumination device according to the first aspect of the present invention in the viewing side of a display device, it is possible to reduce the amount of light leaked from the illumination device (that does not travel towards the display device but travels directly towards the viewer,) and to improve the illumination efficiency. Therefore it is possible to provide a display device such as an electro-optical device which consumes less power and shows higher contrast ratio and excellent display quality. Moreover, this display device makes it possible to provide an electronic instrument with excellent display quality and less power consumption.

Next, the present inventors discovered that when the planar structure of the light emitting elements has periodicity, if the illumination device is provided in a display device such as a liquid crystal display device or the like that is provided with pixels arranged in an array configuration, then the periodic structure of the light emitting elements interferes with the periodic structure of the pixels of the display device leading in some cases to moire stripes being generated. Therefore, the present inventors examined how to make the moiré stripes invisible.

For example, when the light emitting elements are formed in a lattice configuration, the period of the moiré stripes l is defined by the following Equation (1):

$$l = \frac{d_1 d_2}{\sqrt{d_1^2 + d_2^2 - 2d_1 d_2 \cos\theta}} \quad (1)$$

Here, the angle between the direction in which the light emitting elements extend and the direction in which the pixels of the display device are aligned is θ, the interval between light emitting elements is d1, and the interval between the pixels of the display deice is d2.

As understood by Equation (1), when d1=d2 and θ=0, then the period l of the moiré stripes is at its longest and the moire phenomenon is most visible.

Accordingly, in the illumination device according to the second aspect of the present invention, when the pattern of the light emitting elements has periodicity, the present inventors discovered that if the interval of the light emitting elements (at least the interval of the reflective electrodes forming the light emitting elements) is different from the interval of the pixels of the display device, then it is possible to make the moiré stripes invisible even when the illumination device of the second aspect of the present invention is provided in a display device.

Note that when the pixels are arranged in an array configuration, two types of interval exist for the pixels of the display device. On the other hand, although one or a plurality of types of interval exist for the light emitting elements, in the illumination device of the second aspect of the present invention, it is desirable for all of the intervals of the light emitting elements and all of the intervals of the pixels of the display device to be different values.

In addition, the present inventors discovered that in the illumination device according to the second aspect of the present invention, when the light emitting elements are formed with a lattice pattern on one surface of the transparent substrate, and the direction in which the light emitting elements extend (at least the direction in which the reflective electrodes forming the light emitting elements extend) is not parallel to the direction in which the pixels of the display device, it is also possible to make the moiré stripes invisible.

Note that when the pixels are arranged in an array configuration, two types of alignment direction exist for the pixels of the display device. On the other hand, although one or extending directions exist for the light emitting elements, in the illumination device of the second aspect of the present invention, it is desirable that all of the extending directions of the light emitting elements be not parallel to all of the alignment directions of the pixels of the display device.

The present inventors also discovered that it is also desirable that, when the light emitting elements are formed with a lattice pattern on one surface of the transparent substrate, a structure be employed in which the intervals of the light emitting elements are different from the intervals of the pixels of the display device, and at the same time the extending directions of the light emitting elements are not parallel to the alignment directions of the pixels of the display device. The present inventors discovered that this structure makes it possible to make the moiré stripes invisible.

Furthermore, in the second aspect of the present invention, the present inventors also discovered that it is desirable for the intervals of the light emitting elements to be random on the surface of the transparent substrate, and that if this structure is employed, it is possible to make the moiré stripes invisible.

Examples of light emitting elements whose lattice pattern has periodicity are in a striped configuration, a square lattice configuration, and a hexagonal lattice configuration.

Moreover, in the illumination device according to the second aspect of the present invention, because the reflective electrode forming the light emitting elements is opaque, the light emitting elements are partially formed on the surface of the transparent substrate. Thus, the light emitting elements are aligned with some interval. The greater the interval between the light emitting elements, the more the illuminance on a display device decreases. However, the present inventors discovered that when the intervals between light emitting elements is less than 830 times the square of the distance between the light emitting element and the reflective layer of the display device, and when the illuminance just under the light emitting element is regarded as 100%, it is possible to obtain the illuminance of 50% or more on the surface of the display device, and therefore uniform illumination can be obtained when the second aspect of the present invention is provided in a display device.

Moreover, when the illumination device according to the second aspect of the present invention is provided in a display device, because the reflective electrode forming the light emitting elements is opaque, it is not possible to see the display where the light emitting elements are formed. Thus, if the area of the light emitting elements expands, the visibility of the display decreases when the illumination device according to the second aspect of the present invention is provided in a display device. Therefore, in the illumination device according to the second aspect of the present invention, it is desirable that the ratio of the area of the light emitting elements to the area of the transparent substrate be less than 0.5. By employing this setting, the display can be viewed when the illumination device of the second aspect of the present invention is provided in a display device.

Moreover, in the illumination device according to the second aspect of the present invention, it is desirable that the light emitting layer of the light emitting elements consist of organic electroluminescent material. By thus forming the light emitting layer such that it consists of an organic electroluminescent material, it is possible to emit light at low voltages with a high level brightness, and it is possible to reduce power consumption and to improve the illumination efficiency.

In addition, by providing the illumination device according to the second aspect of the present invention on the viewing side, it is possible to reduce the amount of light leaked from the illumination device that does not travel towards the display device but travels directly towards the viewer, and to improve the illumination efficiency, and to make the moiré stripes invisible. It is therefore possible to provide a display device with high contrast ratio and excellent display quality and less power consumption.

Furthermore, by installing this display device, it is possible to provide an electronic instrument that has excellent display quality and less power consumption.

Note that the light emitting elements according to each aspect of the present invention include at least one of organic electroluminescent elements, inorganic electroluminescent elements, and organic LEDs, and inorganic LEDs (light emitting diodes).

DETAILED DESCRIPTION OF THE PREFERRED EMBODIMENTS

Next, a detailed description will be given of each of the embodiments of the present invention.

First Embodiment

Figure 1:
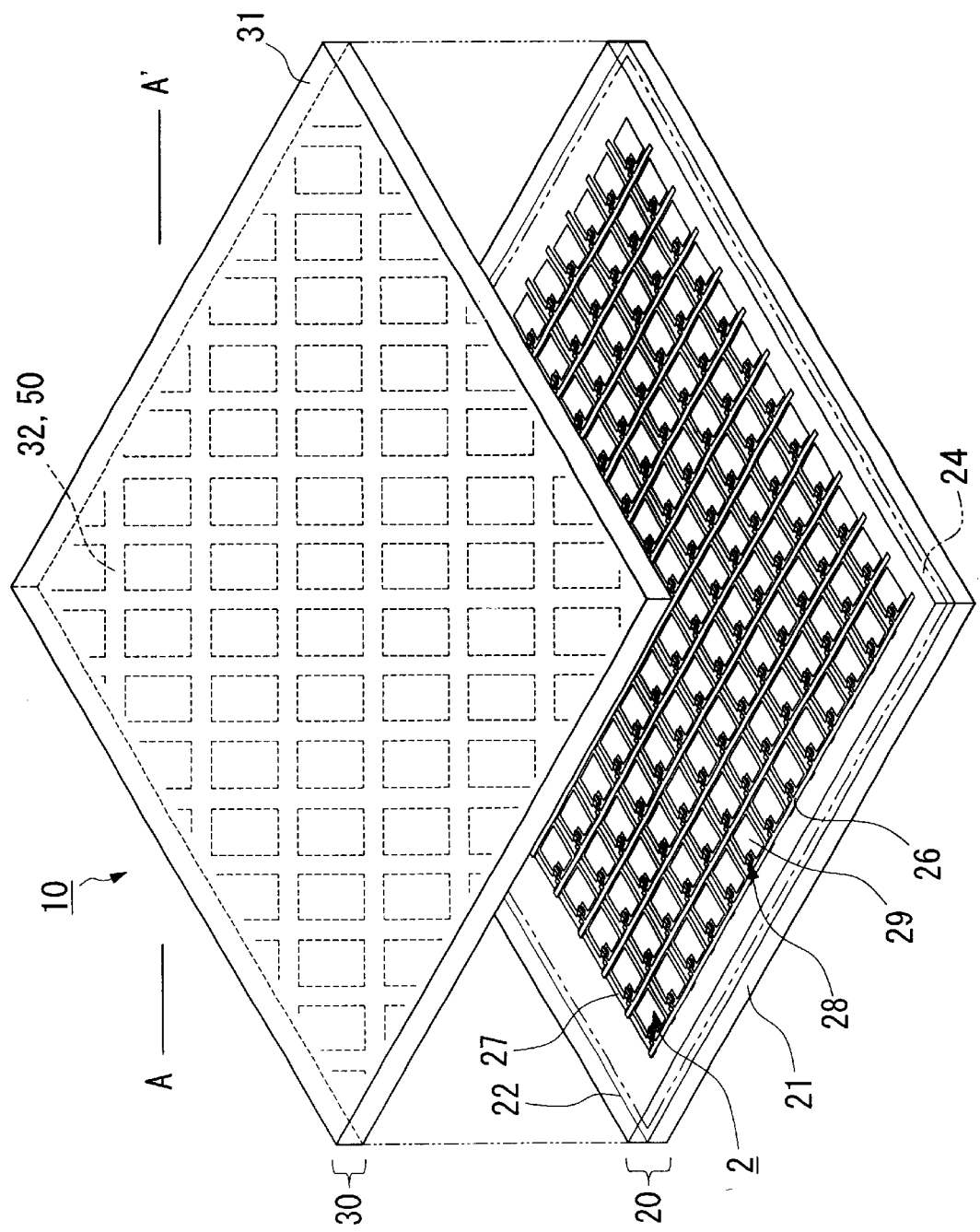
FIG. 1 is a schematic perspective view showing an exploded view of the liquid crystal display device (electro-optical device) of the first embodiment of the present invention.
Figure 2:
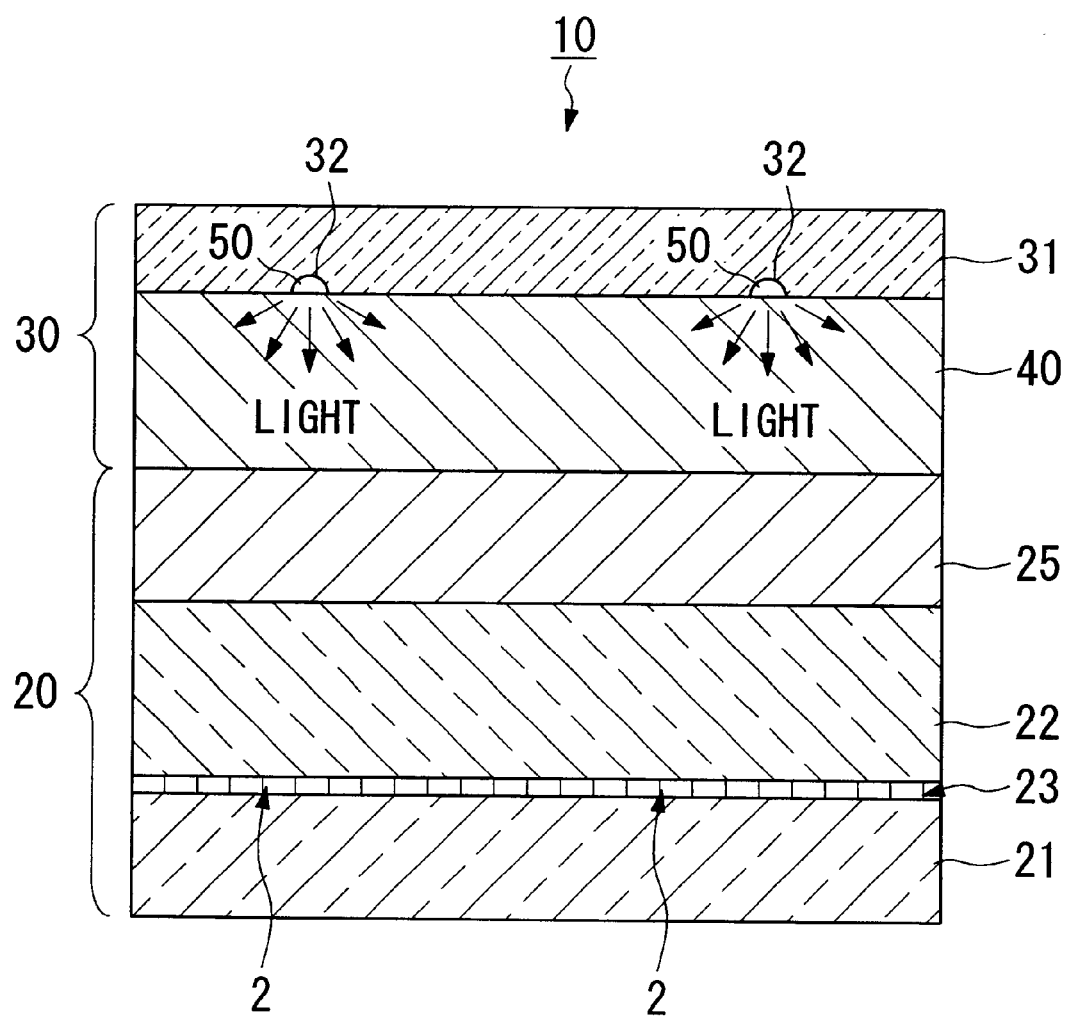
FIG. 2 is a partial schematic cross sectional view of the liquid crystal display device (electro-optical device) of the first embodiment of the present invention.
Figure 3:
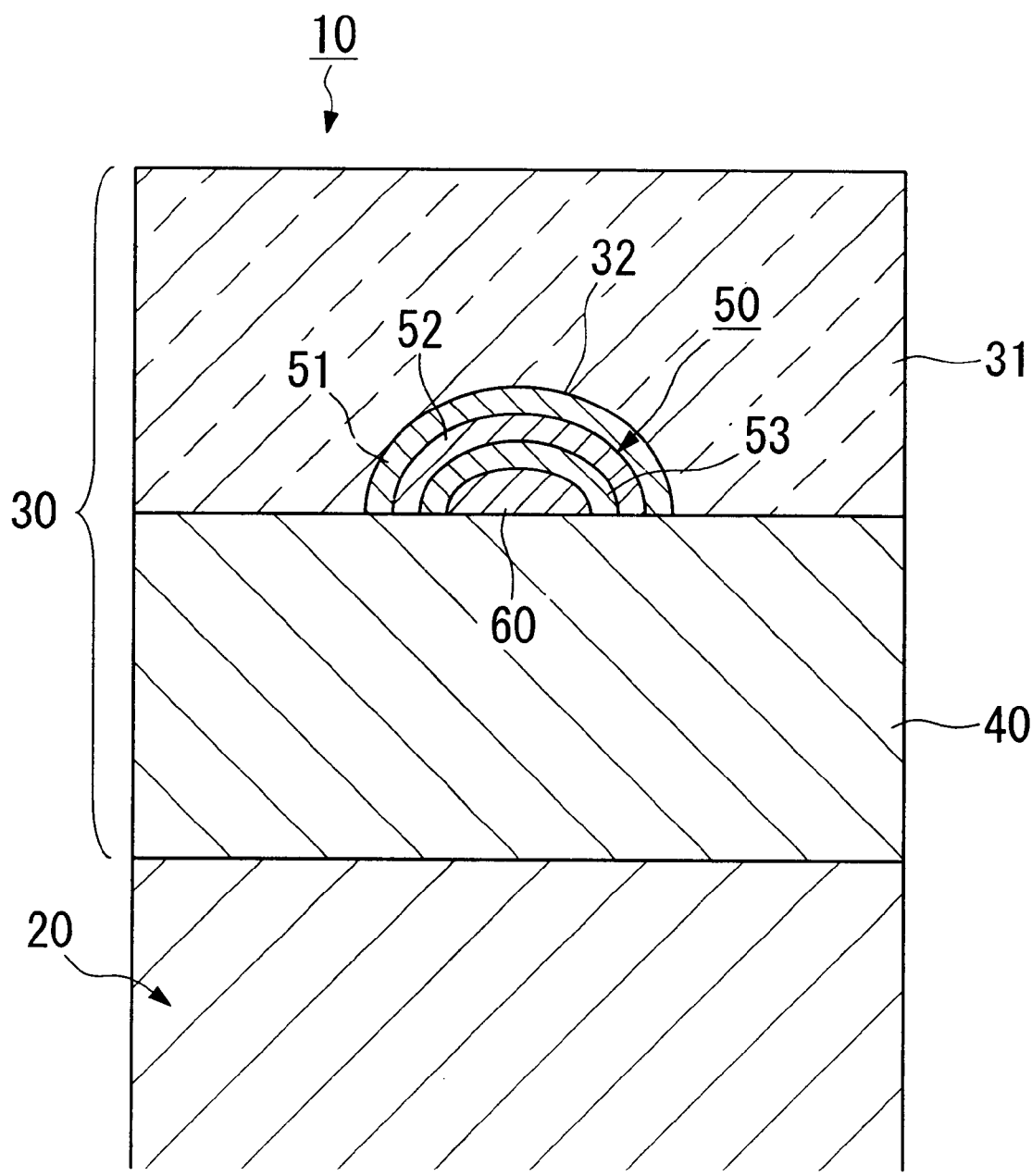
FIG. 3 is a partial schematic cross sectional view showing in enlargement the concavity and the electroluminescent element in the liquid crystal display device (electro-optical device) of the first embodiment of the present invention.

A description will now be given based on FIGS. 1 to 3 of the structure of the illumination device according to the first embodiment of the present invention and an electro-optical device (display device) provided with this illumination device. FIG. 1 is a schematic perspective view showing an exploded view of the electro-optical device of the present embodiment. FIG. 2 is partial schematic cross sectional view of the electro-optical device of the present embodiment. FIG. 3 is a partial schematic cross sectional view showing in enlargement the concavity and the electroluminescent elements described below. Note that the cross sectional views in FIGS. 2 and 3 are of a cross section of the electro-optical device of the present embodiment taken along the line A–A' in FIG. 1. Moreover, in the present embodiment, the example of the electro-optical device that is described is provided with an active matrix type of reflective liquid crystal display device that uses a TFT (Thin Film Transistor) element as a switching element. In addition, in each drawing, the size scale is different for each layer and each member in order to make each layer and each member of a size that can be understood in the drawings.

Firstly, a description will be given based on FIGS. 1 and 2 of the overall structure of a liquid crystal display device (electro-optical device) provided with the illumination device of the present embodiment.

In FIGS. 1 and 2, the number 10 indicates the liquid crystal display device (electro-optical device) of the present embodiment; the number 20 indicates a liquid crystal display panel; and the number 30 indicates the illumination device of the present embodiment.

In FIGS. 1 and 2, the upper side in the drawing of the liquid crystal display panel 20 (i.e. of the liquid crystal display device 10) is the side that provides the display for viewing (i.e. the viewing side). The illumination device 30 of the present embodiment is provided on the viewing side of the liquid crystal display panel 20 and the liquid crystal display device 10 is constructed with the liquid crystal display panel 20 and the illumination device 30 formed as an integral unit. That is, in the present embodiment, the illumination device 30 is constructed as a front light for illuminating the liquid crystal display panel 20 from the viewing side thereof.

As is shown in FIGS. 1 and 2, the basic structure of the liquid crystal display panel 20 is formed with an element substrate (lower side substrate) 21 having TFT elements 28, pixel electrodes 29, and the like formed on the inner surface thereof and a facing substrate (upper side substrate) 22 having a common electrode 24 formed on the inner surface thereof disposed opposite each other, and with a liquid crystal layer (electro-optical material layer) 23 interposed between the element substrate 21 and the facing substrate 22. A polarizer 25 is mounted at the upper side in the drawing of the facing substrate 22. Note that the polarizer 25 and the liquid crystal layer 23 have been omitted from FIG. 1. Note also that the element substrate 21, the TFT elements 28 formed on the inner surfaces of the facing substrate 22, the pixel electrodes 29, the common electrode 24, and the like have been omitted from FIG. 2. Note also that FIG. 2 shows the interior of the liquid crystal layer 23 divided into the respective pixels 2.

Note further that, in the present specification, the term "inner surface" of the element substrate 21 and the facing substrate 22 refers to the surface on the liquid crystal layer side of the element substrate 21 and the facing substrate 22.

As is shown in FIG. 1, a multitude of source lines 26 (data lines) and a multitude of gate lines 27 (scan lines) are aligned in a lattice pattern such that they intersect each other on the inner surface of the element substrate 21. A TFT element 28 is formed in the vicinity of each of the source line 26 and gate line 27 intersection points and a pixel electrode 29 is connected via each of the TFT elements 28. On the inner surface of the facing substrate 22 is formed a common electrode 24 corresponding to the display area.

The areas where the respective pixel electrodes 29 are formed in the liquid crystal display panel 20 are the pixels 2. In addition, color filters (omitted from the drawings) are provided on the inner surface of the element substrate 21 for displaying red, green, and blue colors so that each pixel 2 is capable of displaying either a red, green, or blue color.

In the present embodiment, the pixel electrode 29 is formed from aluminum, silver, silver alloy, or the like and functions as a reflective layer. In bright locations, the illumination device 30 is not turned on, but display is instead made when bright external light such as sunlight or the like strikes the liquid crystal display panel 20 from the viewing side, is reflected by the pixel electrodes 29 formed on the inner surface of the element substrate 21, and travels to the viewing side (the upper side on the drawing) again. In contrast, in dark locations, the illumination device 30 is turned on and the display is made when the light that travels towards the liquid crystal display panel 20 by the illumination device 30 is reflected by the pixel electrodes 29 formed on the inner surface of the element substrate 21 and then travels towards the viewer side (the upper side in the drawings) after passing again through the illumination device 30.

Note that instead of forming the pixel electrodes 29 as a reflective layer, it is also possible to employ a structure in which a reflective layer is provided on the inner surface of the element substrate 21 separately from the pixel electrodes 29.

Next, a description will be given of the structure of the illumination device 30 of the present embodiment that is provided in the liquid crystal display device 10.

As is shown in FIGS. 1 and 2, broadly speaking, the illumination device 30 of the present embodiment is formed from: a transparent substrate 31 formed from glass, transparent resin, or the like that has concavities 32 having a concave curved bottom formed in a pattern on the bottom thereof as seen in the drawings; and electroluminescent elements 50 formed within the concavities 32 of the transparent substrate 31. The surface of the transparent substrate 31 on which the concavities 32 are formed is protected by a protective layer 40 formed, for example, from transparent resin, silicon oxide, or both of these. Note that the protective layer 40 is not shown in FIG. 1.

As is shown in FIG. 1, each concavity 32 and electroluminescent element 50 is aligned, for example, in a straight line formation in a direction that intersects the direction in which the gate lines 27 and source lines 26 formed in the element substrate 21 extend such that the whole structure is arranged in a lattice pattern. Note that the pattern of the electroluminescent elements 50 and concavities 32 shown in FIG. 1 is one example and the electroluminescent elements 50 and concavities 32 are not restricted to this pattern.

Next, a detailed description will be given of the structure of the concavities 32 and electroluminescent elements 50 based on FIG. 3. As is shown in FIG. 3, the cross sectional configuration of the concavities 32 may be formed, for example, in a substantially semi-elliptical configuration. Note that, in the present specification, the term "cross section of the concavity" refers to the cross section in a direction orthogonal to the direction in which the concavities extend.

The electroluminescent elements 50 are formed in order from the top as seen in FIG. 3 from a reflective electrode 51, a light emitting layer 52, and a transparent electrode 53. By supplying a current to the reflective layer 51 that functions as a cathode and the transparent electrode 53 that functions as an anode, light can be emitted from the light emitting layer 52. The light emitted from the light emitting layer 52 is reflected by the reflective electrode 51. This structure enables light to travel onto the liquid crystal display panel 20 side (the lower side in the drawing) with a high degree of efficiency.

In the electroluminescent elements 50, the reflective electrode 51 is formed, for example, from aluminum, silver, silver alloy, or the like, while the transparent electrode 53 is formed, for example, from an indium tin oxide or the like. The light emitting layer 52 consists of either one type or a plurality of types of light emitting materials and may use a known organic or inorganic electroluminescent material as the light emitting material. In view of their ability to emit light at low voltages and their high level brightness, the use of organic electroluminescent materials such as quinolinole aluminum complexes, oxazole complexes of zinc, 2-(2-hydroxyphenyl)benzothiazole complexes of zinc, and the like is particularly desirable.

Note that because the reflective electrode 51 formed from aluminum, silver, silver alloy, or the like is opaque, it is not possible to view the locations where the electroluminescent elements 50 are formed. Accordingly, as is shown in FIG. 1, although it is necessary to arrange the electroluminescent elements 50 in a pattern only in parts relative to the surface on the viewing side of the liquid crystal display panel 20, by performing the illumination using the reflection from the reflective elements 51, as is shown in FIG. 2, it is possible to emit light not only to just under the electroluminescent elements 50, but also to the periphery thereof, so that it is possible to illuminate the entire surface of the liquid crystal display panel 20.

In order to flatten the surface of the transparent substrate 31 on which the electroluminescent elements 50 are formed, filler 60 comprising a transparent resin, silicon oxide, or a material formed by providing these in layers is filled into the concavities 32 on the lower side in the drawing of the electroluminescent elements 50.

Note that, in FIG. 3, the filler 60 and the protective layer 40 are formed from different materials; however, it is also possible for the filler 60 and the protective layer 40 to be formed as an integral member.

Next, a description will be given based on FIGS. 4A to 6B of the manufacturing method for the illumination device 30 of the present embodiment provided in the above liquid crystal display device 10. Note that FIGS. 4A to 6B are schematic cross sectional views showing typical views of the illumination device 30 partway through the manufacturing process.

Figure 4A:
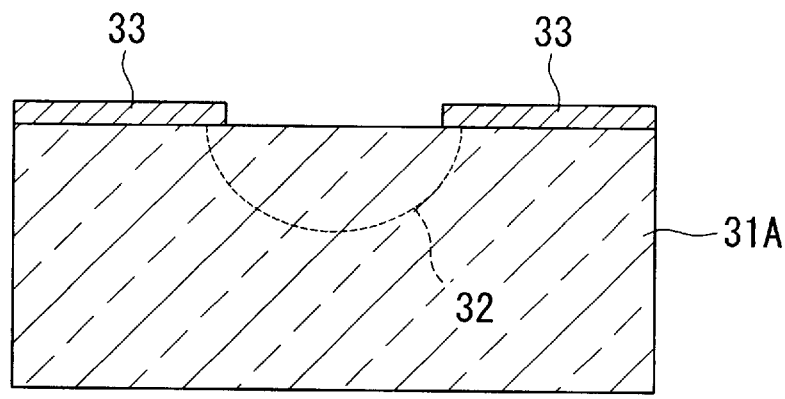
FIGS. 4A and 4B are process drawings showing a method of manufacturing the illumination device of the first embodiment of the present invention.

Firstly, a description will be given based on FIGS. 4A and 4B of the method of manufacturing the transparent substrate 31 on one surface of which the concavities 32 are formed in a pattern. In the example given in the description below, the transparent substrate 31 is formed from a glass substrate.

A transparent substrate 31A is prepared from flat glass and resist is coated over the entire surface on one side of the transparent substrate 31A. By using a mask corresponding to the pattern of the concavities 32 and performing exposure and developing, as is shown in FIG. 4A, resist 33 is formed that corresponds to the pattern of the concavities 32. At this time, as is shown in FIG. 4A, the resist 33 is formed in the areas where the concavities 32 are not formed and in the peripheral portions of the areas where the concavities 32 are formed. Note that, in FIG. 4A, the area where the concavities 32 are formed is shown as a broken line.

Figure 4B:
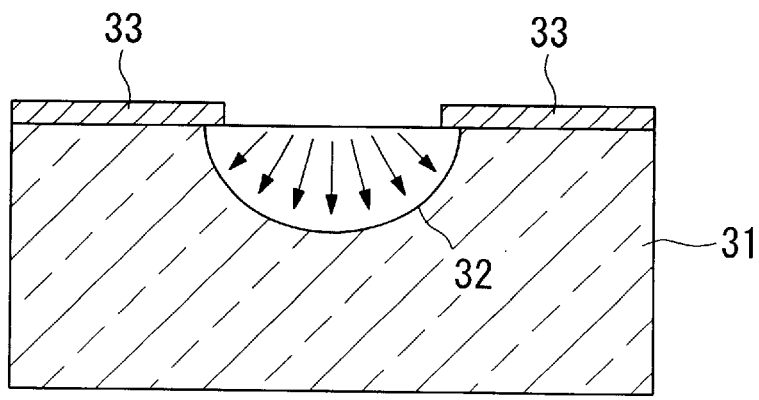

Next, as is shown in FIG. 4B, by performing isotropic etching using hydrofluoric acid solution or the like, the hydrofluoric acid solution or the like penetrates as far as the lower side of the resist 33 that is formed in the peripheral portions of the areas where the concavities 32 are formed, so that the transparent substrate 31A is etched and it is possible to manufacture a transparent substrate 31 on one surface of which concavities 32 that have a concave curved bottom are formed. Note that, in FIG. 4B, the arrows indicate the direction of the etching.

Next, a description will be given based on FIGS. 5A to 6B of the method for manufacturing the illumination device 30 from the transparent substrate 31 on one surface of which are formed the concavities 32. Note that the example in the description is of when the light emitting layer 52 comprises an organic electroluminescent material.

Figure 5A:
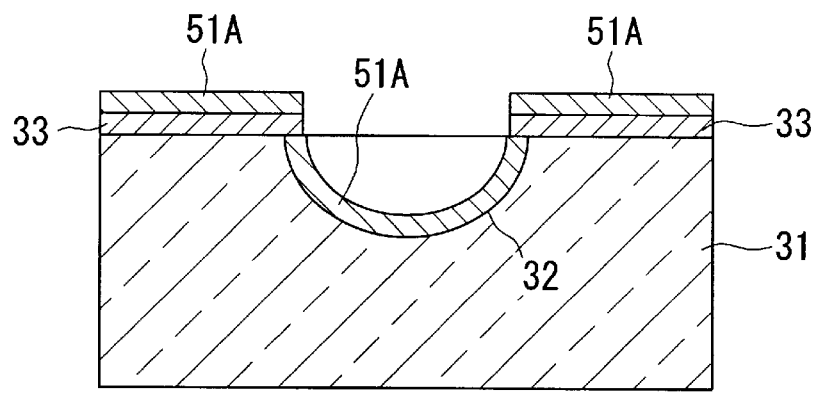
FIGS. 5A and 5B are process drawings showing a method of manufacturing the illumination device of the first embodiment of the present invention.

As is shown in FIG. 5A, a reflective electrode material 51A is deposited on the entire surface of the transparent substrate 31 on the side thereof on which the concavities 32 are formed. The reflective electrode material 51A has a film thickness of 50 to 500 nm and, preferably, of approximately 200 nm and may be formed by sputtering the relevant surface of the transparent substrate 31 with aluminum, silver, silver alloy, or the like.

Figure 5B:
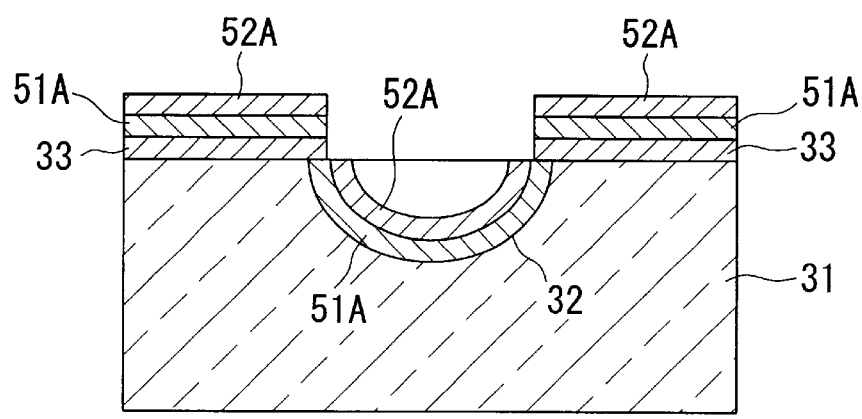

Continuing, as is shown in FIG. 5B, a light emitting layer 52A having a film thickness of 10 to 2000 nm and, preferably, of approximately 200 nm is formed over the entire surface of the transparent substrate 31 on the side thereof on which the reflective electrode material 51A is formed. In order to deposit the light emitting layer 52A, a vapor deposition method or the like may be employed if a low molecular organic electroluminescent material is used, while an inkjet method, a spin coat method, or the like may be employed if a high molecular organic electroluminescent material is used.

Figure 6A:
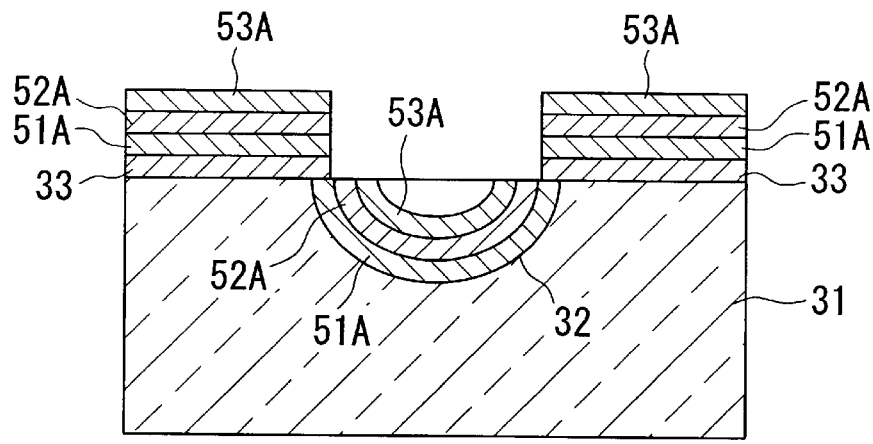
FIGS. 6A and 6B are process drawings showing a method of manufacturing the illumination device of the first embodiment of the present invention.

Next, as is shown in FIG. 6A, a transparent electrode material 53A having a film thickness of 10 to 1000 nm and, preferably, of approximately 250 nm, is formed on the entire surface of the transparent substrate 31 on the side thereof on which the light emitting layer 52A is formed by sputtering this surface with indium tin oxide or the like.

Figure 6B:
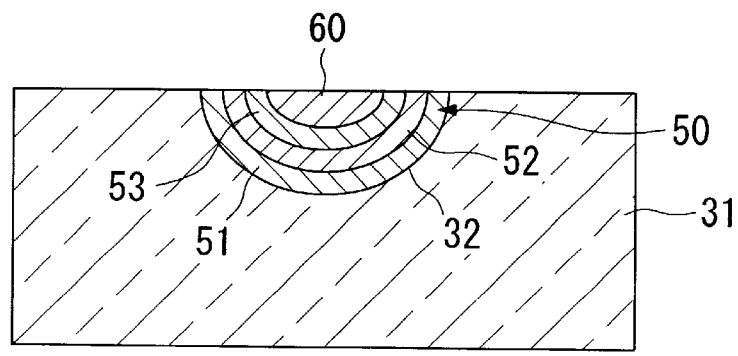

Next, the resist 33 is peeled off. At this time, as is shown in FIG. 6B, the reflective electrode material 51A, the light emitting layer 52A, and the transparent electrode material 53A that are formed in the areas where the concavities 32 are not formed are peeled off (lifted-off) together with the resist 33 and only the reflective electrode material 51A, the light emitting layer 52A, and the transparent electrode material 53A within the concavities 32, that is, the areas where the resist 33 is not formed, is left remaining. In this way, a reflective electrode 51, a light emitting layer 52, and a transparent electrode 53 are formed in a pattern within the concavities 32. Moreover, an electroluminescent element 50 is formed by the reflective electrode 51, the light emitting layer 52, and the transparent electrode 53.

Next, filler 60 is formed on the surface of the electroluminescent element 50 inside the concavities 32. Lastly, a protective layer 40 is formed on the surface of the transparent substrate 31 on the side thereof on which the concavities 32 are formed either by coating a transparent resin thereon, or by vapor depositing silicon oxide using a vapor deposition method, or by providing both of these in layers. As a result, the illumination device 30 having the structure shown in FIG. 3 is manufactured.

Note that, in the present embodiment, a description has been given only for when a transparent substrate 31 is manufactured from glass; however, the present invention is not limited to this. When the transparent substrate 31 is manufactured from a transparent resin, a transparent substrate 31 having concavities 32 formed on one side thereof in a pattern can be manufactured by an injection molding method or the like.

Moreover, in the present embodiment, a description has been given of forming the electroluminescent elements 50 by peeling off (lifting off) the unnecessary reflective electrode material 51A, light emitting layer 52A, and transparent electrode material 53A together with the resist 33; however, the present invention is not limited to this, and patterning can be performed using a photolithography method on a portion of or on all of the layers.

For example, it is also possible to peel off (lift off) the unnecessary reflective electrode material 51A together with the resist 33 after the reflective electrode material 51A has been formed so as to form a reflective electrode 51 having a pattern. Thereafter, a light emitting layer 52 having a pattern can be formed by pouring the material of the light emitting layer 52 into the concavities 32, and then, after a transparent electrode material 53A has been formed on the entire surface, the transparent electrode 53 can be formed in a pattern by a photolithographic method or the like.

However, if the unnecessary reflective electrode material 51A, light emitting layer 52A, and transparent electrode material 53A are peeled off (lifted off) together with the resist 33, after the reflective electrode material 51A, the light emitting layer 52A, and the transparent electrode material 53A have been formed, because there is no need to perform a patterning process for all layers using a photolithographic method or the like, it is possible to form the electroluminescent elements 50 inside the concavities 32 more efficiently.

According to the illumination device 30 of the present embodiment, by employing a structure in which light emitted from the light emitting layer 52 of the electroluminescent element 50 is reflected by the reflective electrode 51 and travels from the opposite side to the reflective electrode 51, it is possible to reduce the amount of light leaked from the illumination device 30 that does not travels towards the liquid crystal display panel 20 but travels directly towards the viewer, and to travel light more efficiently towards the liquid crystal display panel 20. As a result, the illumination efficiency is improved, and it is therefore possible to reduce power consumption.

Moreover, according the illumination device 30 of the present embodiment, because the electroluminescent element 50 is formed inside the concavities 32, it is possible to wrap the light emitting layer 52 with the transparent substrate 31, the reflective electrode 51, and the transparent electrode 53. Therefore, it is possible to prevent deterioration in the light emitting layer 52. In particular, by forming the transparent substrate 31 from a glass substrate or the like that has low gas permeability, the intrusion of water vapor or the like from the outside of the illumination device 30 onto the light emitting layer 52 is prevented, and it is therefore possible to prevent deterioration of the light emitting layer 52.

Moreover, in the illumination device 30 of the present embodiment, it is desirable that the light emitting layer 52 of the electroluminescent element 50 consist of an organic electroluminescent material. By thus forming the light emitting layer 52 from an organic electroluminescent material that is capable of light emissions at low voltages and that has a high level brightness, it is possible to reduce power consumption and to improve the illumination efficiency.

Moreover, in the illumination device 30 of the present embodiment, a structure is employed in which the concavities 32 that have a concave curved bottom are formed in the outgoing surface of the transparent substrate 31, and electroluminescent elements 50 are formed along the curved bottom of the concavities 32. By employing this structure, it is possible to form the reflective surface of the reflective electrode 51 as a concave curved bottom. This enables leakage light leaking from the side of the electroluminescent elements 50 to be reduced and also enables the total reflected light within the transparent electrode 53 and at the boundary of the transparent electrode 53 and the light emitting layer 52 to be reduced. As a result, the light emitted from the light emitting layer 52 can travel more efficiently from one surface of the transparent substrate 31 allowing the illumination efficiency to be improved.

Moreover, in the present embodiment, because a structure is employed in which the electroluminescent elements 50 are formed inside the concavities 32 in the transparent substrate 31, it is possible to simplify the patterning process for the reflective electrode 51, the light emitting layer 52, and the transparent electrode 53.

Moreover, because the liquid crystal display device (electro-optical device) 10 of the present embodiment is provided on the viewing side thereof with the illumination device 30 of the present embodiment, leakage light from the illumination device 30 that does not travel towards the liquid crystal display panel 20 but travels directly towards the viewer is reduced and the liquid crystal display device 10 is given an excellent display quality with high contrast ratio and also reduces power consumption.

Note that, in the present embodiment, a description is given only of when the reflective electrode 51, the light emitting layer 52, and the transparent electrode 53 are formed along the entire concave curved bottom of the concavities 32; however, the present invention is not limited to this, and any configuration may be employed provided that the reflective electrode 51, the light emitting layer 52, and the transparent electrode 53 are sequentially layered inside the concavities 32.

However, in order to form the reflective surface of the reflective electrode 51 as a curved bottom, it is desirable that at least the reflective electrode 51 be formed along the entire curved bottom or a portion of the curved bottom of the concavities 32.

Moreover, in the present embodiment, a structure is employed in which the reflective electrode 51, the light emitting layer 52, and the transparent electrode 53 are formed only inside the concavities 32; however, the present invention is not limited to this, and it is sufficient when at least the reflective electrode 51 is formed inside the concavities 32.

A description will now be given of an example of the structure of an electroluminescent element 50 other than that described in the present embodiment.

Figure 7A:
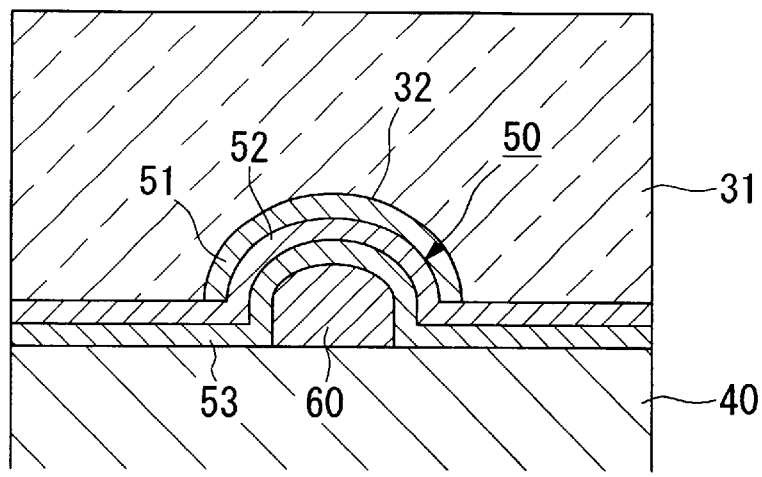
FIGS. 7A to 7C are schematic cross sectional views showing further examples of the concavity and the electroluminescent element in the first embodiment of the present invention.

As is shown in FIG. 7A, it is also possible to employ a structure in which the reflective electrode 51 is formed only inside the concavities 32, while the light emitting layer 52 and the transparent electrode 53 are formed across the entire surface of the transparent substrate 31 on which the concavities 32 are formed including inside the concavities 32.

Figure 7B:
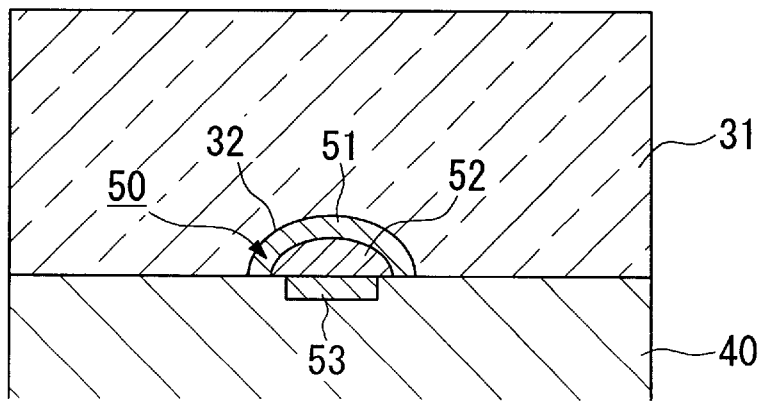

Moreover, as is shown in FIG. 7B, it is also possible to employ a structure in which the reflective electrode 51 and the light emitting layer 52 are formed inside the concavities 32 and the transparent electrode 53 is formed on the outside of the concavities 32, that is, on the surface of the light emitting layer 52.

Moreover, it is also possible to employ a structure in which only the reflective electrode 51 is formed inside the concavities 32 and the light emitting layer 52 and the transparent electrode 53 are formed on the outside of the concavities 32, that is, on the surface of the reflective electrode 51. However, in this case, because the light reflecting surface of the reflective electrode 51 is a flat surface, the illumination efficiency is reduced compared with when the light reflecting surface of the reflective electrode 51 is a concave curved bottom.

In this way, in the present embodiment, because at least the reflective layer 51 is formed inside the concavities 32, it is necessary to set the depth of the concavities 32 to be at least greater than the film thickness of the reflective electrode 51.

However, because it is possible to form the light reflecting surface of the reflective electrode 51 as a concave curved bottom and to improve the illumination efficiency, and also to prevent deterioration in the light emitting layer 52, it is desirable that at least the reflective electrode 51 and the light emitting layer 52 be formed within the concavities 32. In this case, it is necessary that the depth of the concavities 32 be set to at least greater than the sum of the film thickness of the reflective electrode 51 and the light emitting layer 52.

Figure 7C:
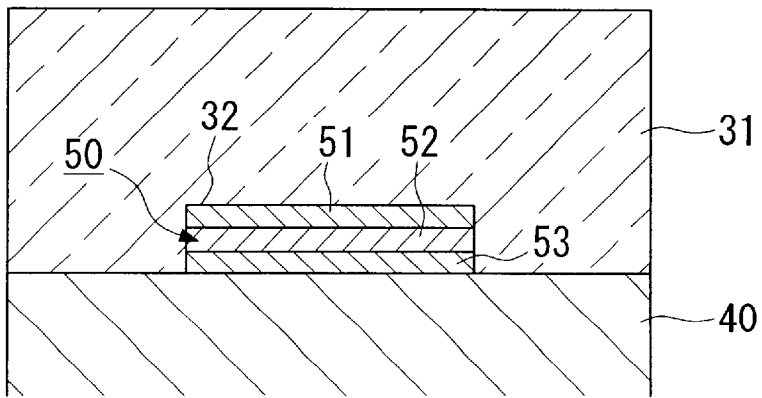

Moreover, in the present embodiment, a description is given only of when concavities 32 having a concave curved bottom are formed; however, the present invention is not limited to this and, as is shown in FIG. 7C, it is also possible to employ a structure in which the concavities 32 are formed with a substantially rectangular shaped cross section and the electroluminescent elements 50 are formed along the bottom (the surface on the upper side in the drawing) of the concavities 32.

In this way, when the concavities 32 are formed with a substantially rectangular shaped cross section, because the light reflecting surface of the reflective electrode 51 is a flat surface, the illumination efficiency is reduced compared with when the light reflecting surface of the reflective electrode 51 is a concave curved bottom. However, compared with when the concavities have a curved concave surface, the level of air tightness of the light emitting layer 52 is greater and the weatherability is improved.

In the above described illumination device of the first embodiment, a structure is employed in which concavities are provided on the outgoing surface of a transparent substrate; however, the present invention is not limited to this.

Second Embodiment

Next, in the second embodiment, a description will be given of an illumination device in which concavities are provided on the opposite surface of the transparent substrate from the outgoing surface.

A description will now be given based on FIG. 8 of the structure of the illumination device of the second embodiment of the present invention as well as of a liquid crystal display device (electro-optical device) in which this illumination device is provided. The overall structure of the liquid crystal display device of the present embodiment is the same as the structure of that shown in FIGS. 1 and 2 in the first embodiment; therefore, a description thereof is omitted here. In addition, FIG. 8 corresponds to FIG. 3 of the first embodiment and the same reference numbers are given to structural elements that are the same as in the first embodiment and a description thereof is omitted.

Figure 8:
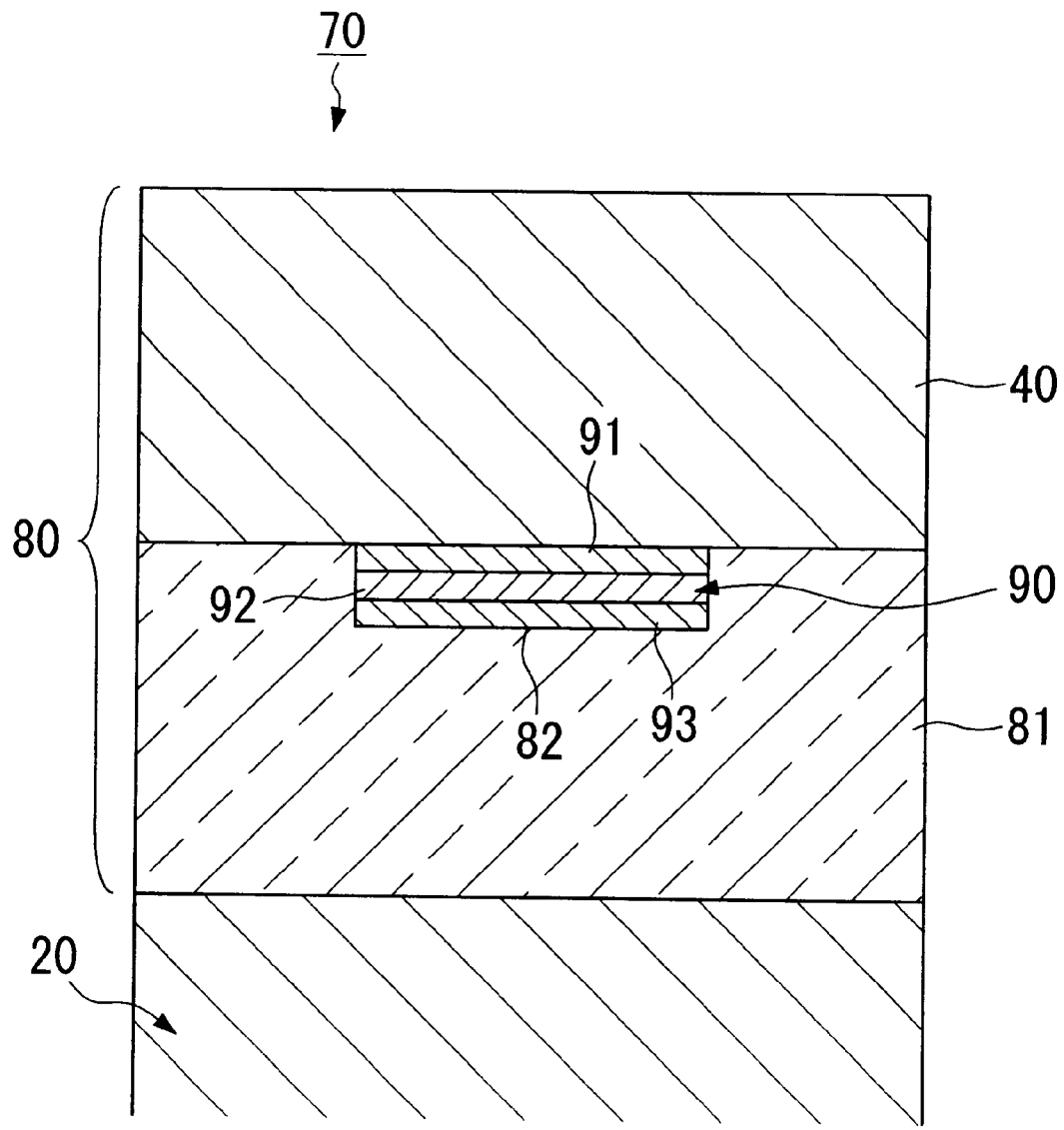
FIG. 8 is a partial schematic cross sectional view of the liquid crystal display device (electro-optical device) of the second embodiment of the present invention.

In FIG. 8, the number 70 indicates the liquid crystal display device (electro-optical device) of the present embodiment, while the number 80 indicates the illumination device of the present embodiment.

As is shown in FIG. 8, in the same way as in the first embodiment, the illumination device 80 of the present embodiment is provided on the viewing side (the upper side in the figure) of the liquid crystal display panel 20. The liquid crystal display device 70 is constructed by integrating the liquid crystal display panel 20 and the illumination device 80. That is, in the same way as in the first embodiment, in the present embodiment as well, the illumination device 80 is formed as a front light that illuminates the liquid crystal display panel 20 from the viewing side.

In the illumination device 80 of the present embodiment, concavities 82 having a substantially rectangular shaped cross section are formed in a pattern on the surface on the upper side in the drawing of the transparent substrate 81 formed from glass, transparent resin, or the like. Electroluminescent elements 90 are formed inside the concavities 82 and the surface of the transparent substrate 81 on which the concavities 82 are formed is protected by a protective layer 40. Note that the concavities 82 and the electroluminescent elements 90 are formed in a lattice configuration, for example, in the same way as in the first embodiment.

That is, while the concavities are formed on the outgoing surface of the transparent substrate in the first embodiment, in the present embodiment, the concavities 82 are formed on the surface on the opposite side of the transparent substrate 81 to the outgoing surface.

Moreover, while the protective layer is on the liquid crystal display panel side and the transparent substrate is on the viewer's side in the illumination device in the first embodiment, in the present embodiment, in the illumination device 80, the transparent substrate 81 is on the liquid crystal display panel 20 side and the protective layer 40 is on the viewer's side.

In addition, in the concavities 82, the electroluminescent elements 90 are formed along the bottom of the concavities 82 (the lower side in the drawing) from layers comprising a transparent electrode 93, a light emitting layer 92, and a reflective electrode 91 in order from the lower side in the drawing. In the same way as in the first embodiment, a structure is employed in which light emitted by the light emitting layer 92 is reflected by the reflective electrode 91 so that the light can efficiently travel towards the liquid crystal display panel 20 (the lower side in the drawing). Because the materials used for the reflective electrode 91, the light emitting layer 92, and the transparent electrode 93 are the same as those in the first embodiment, a description thereof is omitted here.

Moreover, while filler is provided inside the concavities in order to flatten the surface of the transparent substrate in which the electroluminescent elements are formed in the first embodiment, in the present embodiment, the electroluminescent elements 90 are formed without any gaps inside the concavities 82 so that no filler is formed. However, the present embodiment is not limited to this, and if the depth of the concavities 82 is greater than the thickness of the electroluminescent elements 90, then because a gap is created inside the concavities 82, it is desirable that filler be formed inside the concavities 82 in the same way as in the first embodiment.

Next, a description will be given of the method used to manufacture the illumination device 80 of the present embodiment using as an example a transparent substrate 81 made from a glass substrate.

A transparent substrate is prepared from flat glass. Resist is then applied to the entire surface on one side of this transparent substrate. Using a mask corresponding to the pattern of the concavities 82, exposure and developing processes are performed so that a resist that corresponds to the pattern of the concavities 82 is obtained. While the resist pattern is formed in the areas where no concavities are formed and in the portions peripheral to the areas where the concavities are formed in the first embodiment, in the present embodiment, the resist pattern is only formed in the areas where no concave areas are formed.

Next, by performing anisotropic etching such as RIE (Reactive Ion Etching), it is possible to manufacture a transparent substrate 81 on one surface of which are formed in a pattern concavities 82 that have a rectangular shaped cross section.

Next, in the same way as in the first embodiment, electroluminescent elements 90 are formed inside the concavities 82 of the transparent substrate 81. While the bottom of the concavities 82 was the reflective electrode and the side opposite the bottom was the transparent electrode in the first embodiment, in the present embodiment, the bottom of the concavities 82 is the transparent electrode 93, and the side opposite the bottom is the reflective electrode 91. Thus, in the present embodiment, the electroluminescent elements 90 are formed inside the concavities 82 by forming the transparent electrode 93, the light emitting layer 92, and the reflective electrode 91, in that order.

That is, by forming in sequence a transparent electrode material, a light emitting layer, and a reflective electrode material in stacked layers over the entire surface of the transparent substrate 81 on the side thereof on which the concavities 82 are formed, and then peeling off the resist, the transparent electrode material, the light emitting layer, and the reflective electrode material that are formed in those areas where the concavities 82 are not formed are peeled off (lifted off) together with the resist. Thus, only the areas where no resist is formed, that is, the transparent electrode material, light emitting layer, and reflective electrode material formed inside the concavities 82 is left remaining, resulting in a transparent electrode 93, a light emitting layer 92, and a reflective electrode 91 formed in a pattern inside the concavities 82. The electroluminescent elements 90 comprising the transparent electrode 93, the light emitting layer 92, and the reflective electrode 91 are also formed.

Lastly, in the same way as in the first embodiment, by forming the protective layer 40 on top of the surface of the transparent substrate 81 on the side thereof on which the concavities 82 are formed, the illumination device 80 having the structure shown in FIG. 8 is manufactured.

According to the illumination device 80 of the present embodiment, in the same way as in the first embodiment, it is possible to reduce the amount of light leaked from the illumination device 80 that travels directly towards the viewer but does not travel towards the liquid crystal display panel 20 by employing a structure in which light emitted from the light emitting layer 92 of the electroluminescent element 90 is reflected by the reflective electrode 91 and travels from the opposite side to the reflective electrode 91. In addition, because it is possible to travel light more efficiently towards the liquid crystal display panel 20, the illumination efficiency is improved, and therefore a reduction in power consumption can be achieved.

Moreover, according the illumination device 80 of the present embodiment, in the same way as in the first embodiment, because the electroluminescent element 90 is formed inside the concavity 82, it is possible to wrap the light emitting layer 92 with the transparent substrate 81, the reflective electrode 91, and the transparent electrode 93. Therefore, it is possible to prevent deterioration in the light emitting layer 92.

Moreover, in the illumination device 80 of the present embodiment, a structure is employed in which concavities 82 having a rectangular shaped cross section are formed in the surface of the transparent substrate 81 on the opposite side from the outgoing surface and electroluminescent elements 90 are formed along the bottom of the concavities 82. Because the light emitting layer 92 is disposed closer to the liquid crystal display panel 20 than the boundary face of the transparent substrate 81 and the protective layer 40 as a result of employing this structure, it is possible to prevent the reflection of emitted light at the boundary face of the transparent substrate 81 and the protective layer 40.

Moreover, in the present embodiment, in the same way as in the first embodiment, because a structure is employed in which the electroluminescent elements 90 are formed inside the concavities 82 in the transparent substrate 81, the patterning process for the reflective electrode 91, the light emitting layer 92, and the transparent electrode 93 is unnecessary.

Moreover, because the liquid crystal display device (electro-optical device) 70 of the present embodiment is provided on the viewing side thereof with the illumination device 80 of the present embodiment, leakage light from the illumination device 80 that travels directly towards the viewer but does not travel towards the liquid crystal display panel 20 is reduced and the liquid crystal display device 70 is given an excellent display quality with high contrast ratio and also reduces power consumption.

Note that while in the first embodiment, because the electroluminescent elements were preferably formed inside the concave sections starting from the reflective electrode, it was possible for the light emitting layer and the transparent electrode or for the transparent electrode alone to be formed outside the concavities, in the present embodiment, because it is necessary to form the electroluminescent elements 90 inside the concavities 82 starting from the transparent electrode 93, it is necessary for the reflective electrode 91, the light emitting layer 92, and the transparent electrode 93 to all be formed inside the concavities 82 in order for the reflective electrode 91 to be formed inside the concavities 82

Thus, in the present embodiment, the depth of the concavities 82 needs to be the same as or greater than the sum of the total film thickness of the reflective electrode 91, the light emitting layer 92, and the transparent electrode 93.

Experimental Examples

A comparison was made between the illumination efficiency when concavities having a concavely curved bottom (i.e. concavities having a substantially semi-elliptical cross section) were formed in the transparent substrate and the illumination efficiency when concavities having a flat bottom (i.e. concavities having a substantially rectangular cross section) were formed in the transparent substrate. The concavities in both cases had a width of 4 $\mu$m and a depth of 650 nm (this was the maximum depth in the case of the concavities having a substantially semi-elliptical cross section). Electroluminescent elements were formed along the entire bottom of both types of concavity.

Furthermore, in each case, the electroluminescent elements were formed with a layered structure comprising a reflective electrode formed from aluminum having a film thickness of 200 nm; a light emitting layer formed from a high molecular organic electroluminescent material having a film thickness of 200 nm; and a transparent electrode formed from indium tin oxide having a film thickness of 250 nm.

Figure 9:
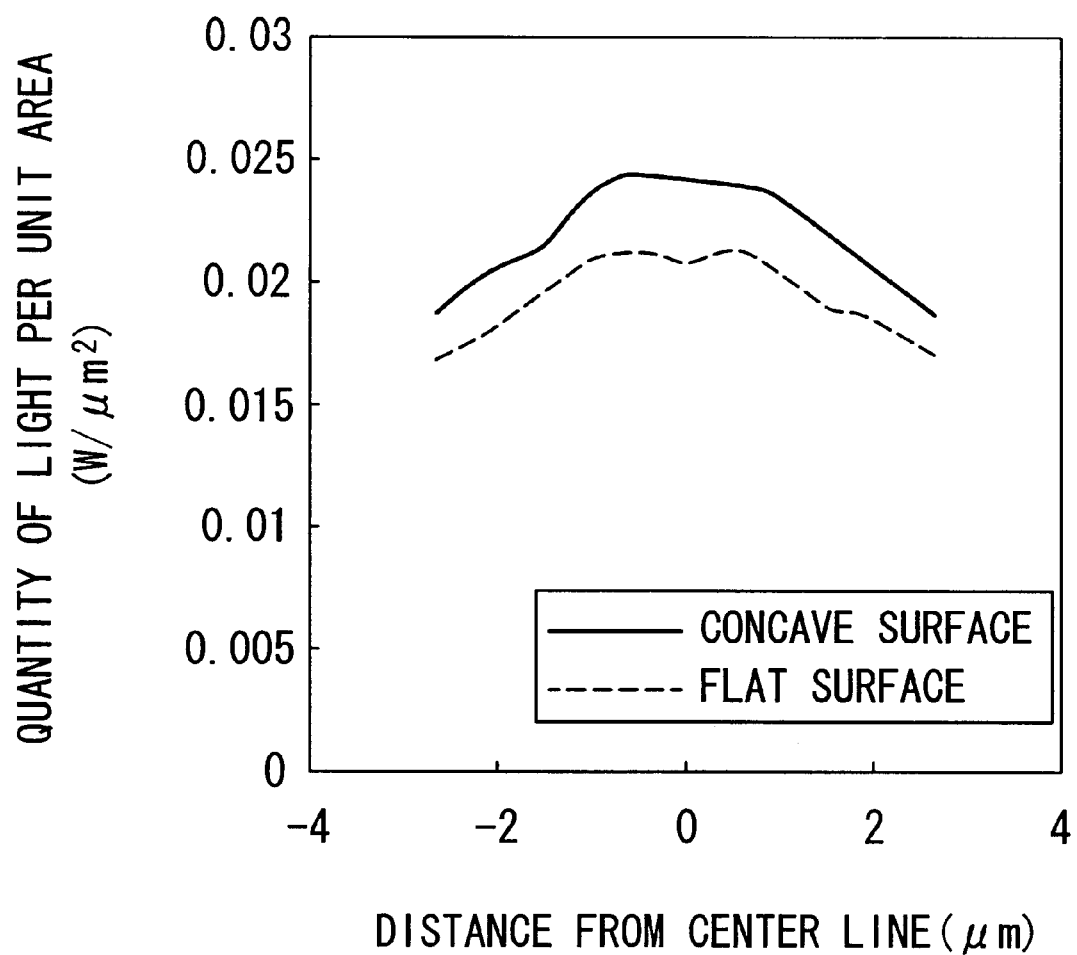
FIG. 9 is a view showing the result when a comparison is made between the illumination efficiency when a concavity having a substantially semi-elliptical shaped cross section is formed on a transparent substrate and the illumination efficiency when a concavity having a substantially rectangular cross section is formed on a transparent substrate.

The results when the quantity of light per unit area relative to the distance from the centerline of the concavity cross section is measured are shown in FIG. 9. Note that the centerline of the concavity cross section refers to the centerline in the vertical direction relative to the surface of the transparent substrate.

As is shown in FIG. 9, in the case of the concavity with a concave curved bottom, the quantity of light per unit area is greater than when the concavity is formed with a flat bottom and it was determined that the illumination efficiency was improved.

Third Embodiment

Figure 10:
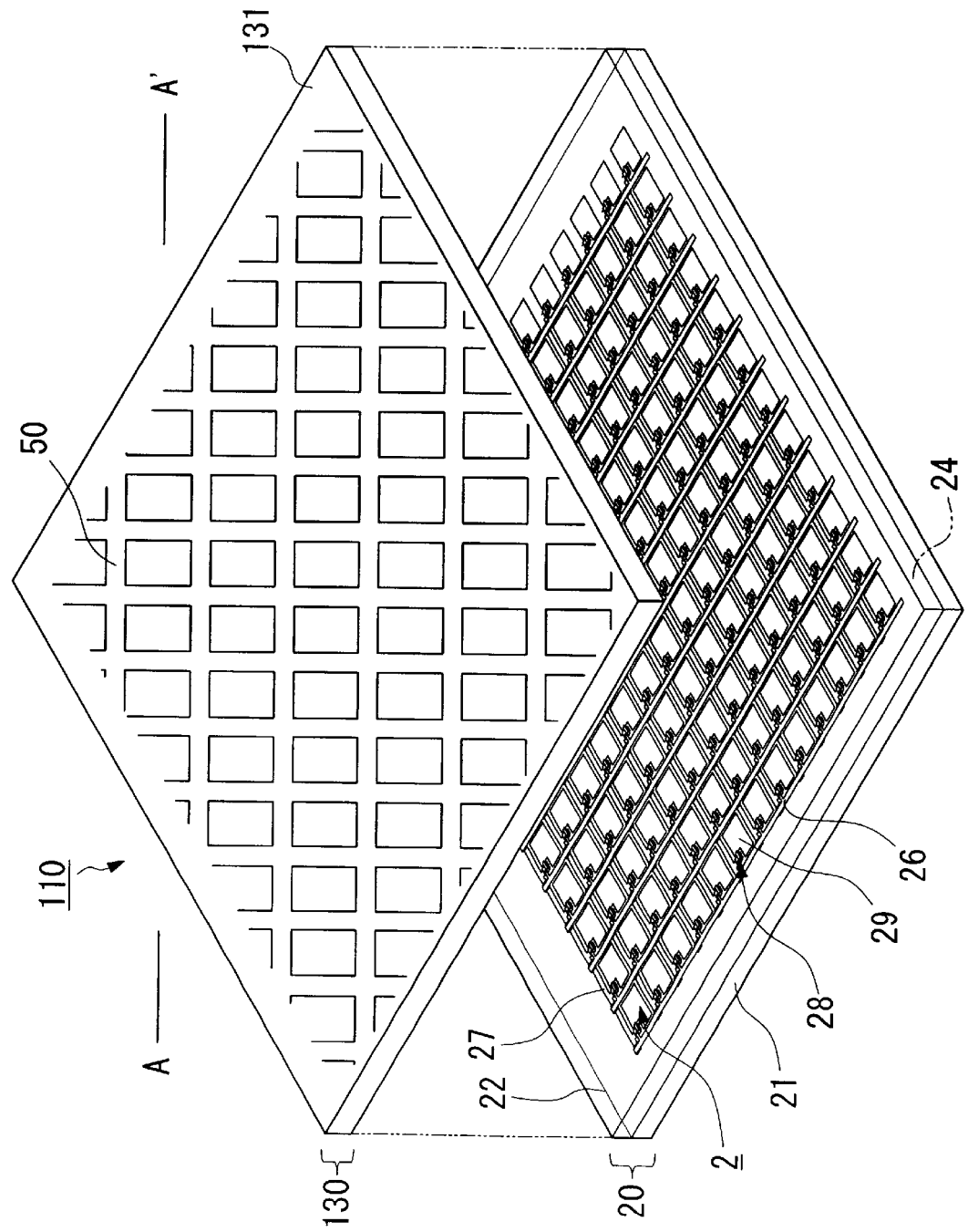
FIG. 10 is a schematic perspective view showing an exploded view of the liquid crystal display device of the third embodiment of the present invention.
Figure 11:
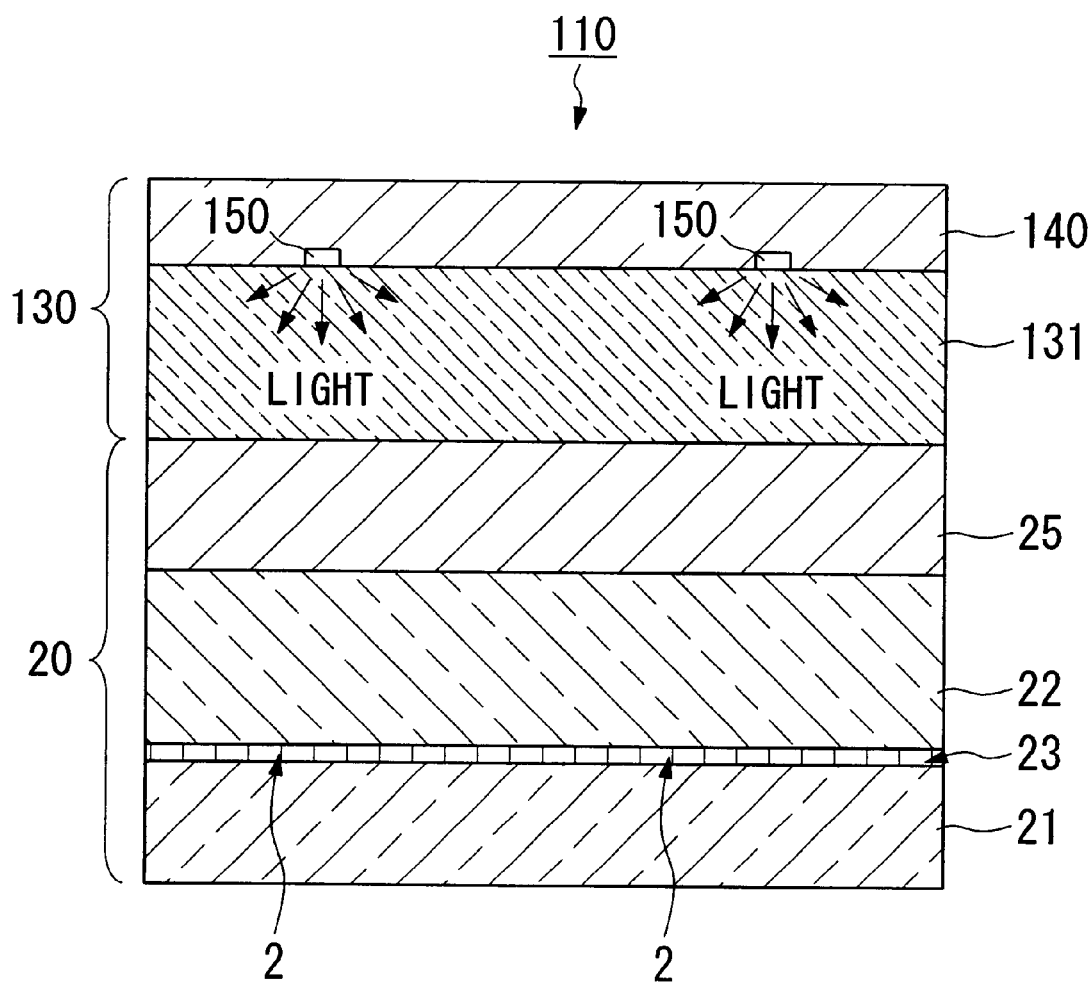
FIG. 11 is a partial schematic cross sectional view of the liquid crystal display device of the third embodiment of the present invention.
Figure 12:
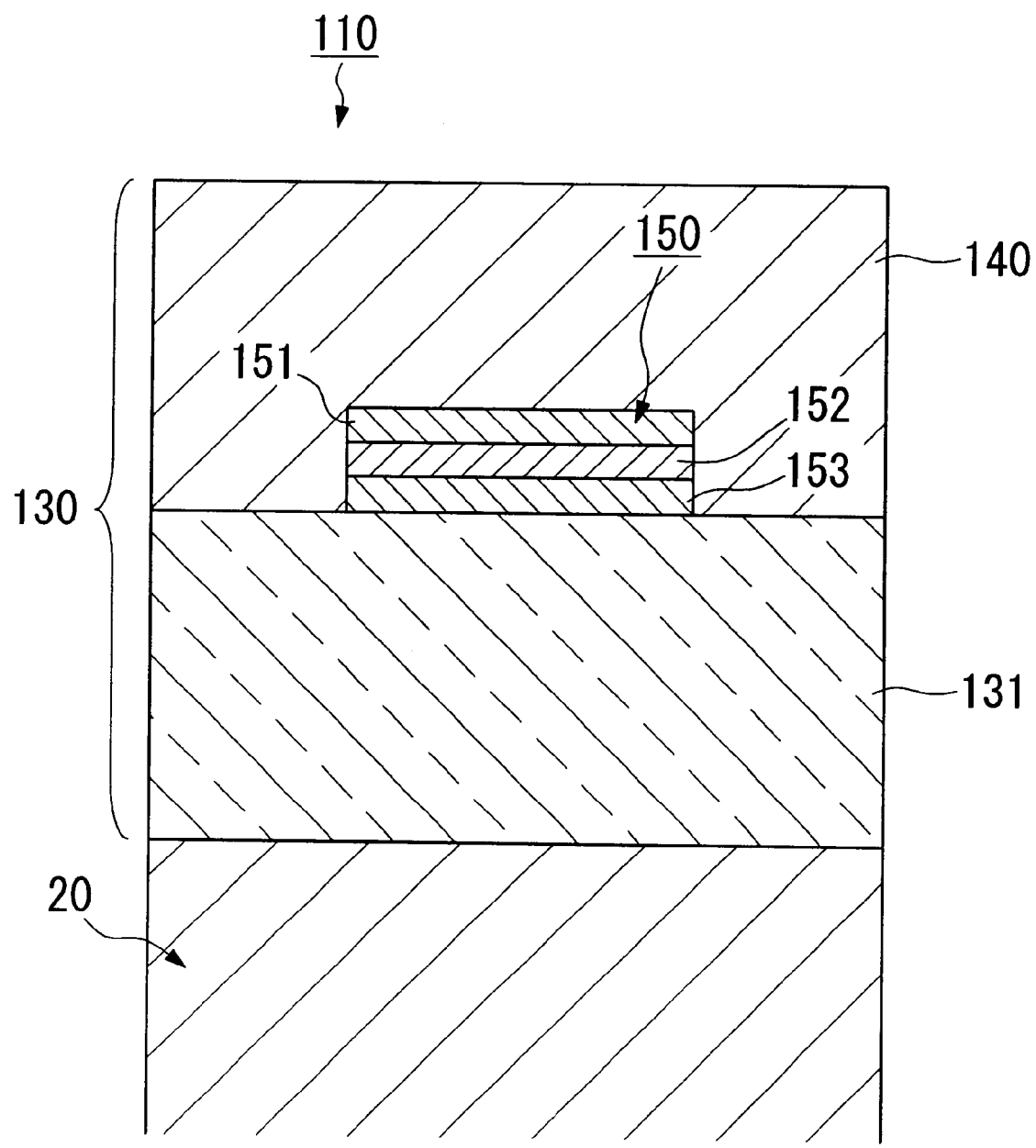
FIG. 12 is a partial schematic cross sectional view showing in enlargement the electroluminescent element in the liquid crystal display device of the third embodiment of the present invention.
Figure 13:
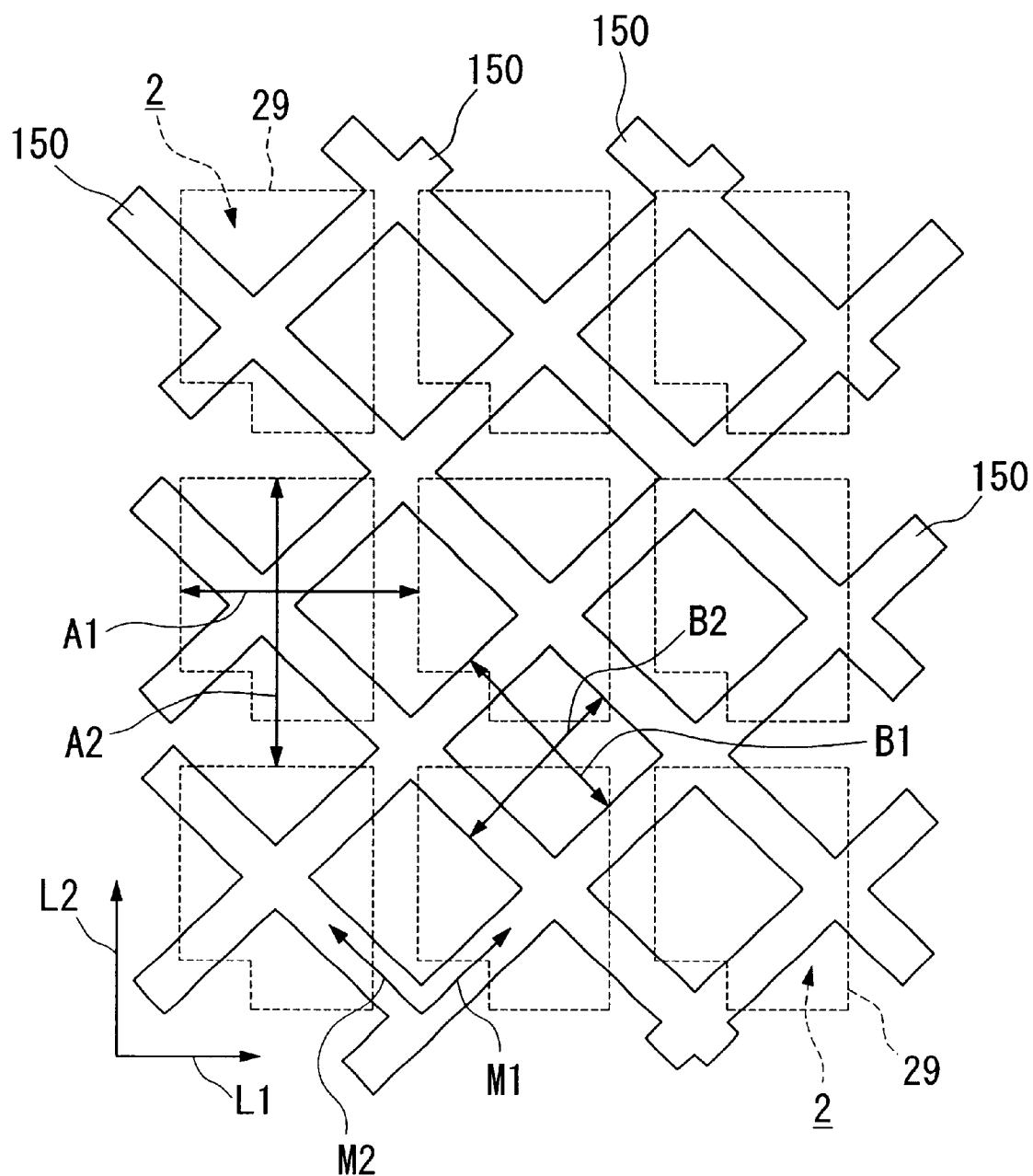
FIG. 13 is a schematic plan view showing the relationship between the pattern of the electroluminescent element and the layout of the pixels of the liquid crystal display device in the liquid crystal display device of the third embodiment of the present invention.

A description will now be given based on FIGS. 10 to 13 of the structures of the illumination device of the present embodiment and a display device provided with this illumination device. FIG. 10 is a schematic perspective view showing an exploded view of the display device of the present embodiment. FIG. 11 is a partial schematic cross sectional view of the display device of the present embodiment. FIG. 12 is a partial schematic cross sectional view showing in enlargement the electroluminescent element described below. FIG. 13 is a schematic plan view showing the relationship between the pattern of the pixels of the display device and the pattern of the electroluminescent element described below. Note that FIGS. 11 and 12 are cross sections of the display device of the present embodiment with the cross section taken along the line A–A' shown in FIG. 10.

In the present embodiment, the example of the display device that is described is provided with an active matrix type of reflective liquid crystal display device that uses a TFT element as a switching element. In addition, in each drawing, the size scale is different for each layer and each member in order to make each layer and each member of a size that can be understood in the drawings.

As is shown in FIGS. 10 and 11, other than the specific structure of the illumination device, the overall structure of the liquid crystal display device is the same as that of the liquid crystal display device shown in FIGS. 1 and 2 in the first embodiment. Note that, in FIGS. 10 and 11, the number 110 indicates the liquid crystal display device of the present embodiment that corresponds to the liquid crystal display device 10 of the first embodiment, while the number 130 indicates the illumination device of the present embodiment that corresponds to the illumination device 30 of the first embodiment Next, a description will be given of the structure of the illumination device 130 of the present embodiment that is provided in the liquid crystal display device 110.

As is shown in FIGS. 10 and 11, broadly speaking, the illumination device 130 of the present embodiment is constructed from a transparent substrate 131 formed from glass, transparent resin, or the like; and electroluminescent elements 150 formed in a pattern on the surface of the transparent substrate 131 on the upper side as seen in the drawing. The surface of the transparent substrate 131 on the side on which the electroluminescent elements 150 are formed is protected by a protective layer 140 formed from transparent resin, silicon oxide, or both of these. Note that the protective layer 140 has been omitted from the drawing.

As is shown in FIG. 10, each of the electroluminescent elements 150 is placed in a straight line such that as a whole they form a square lattice configuration with the planar structure having periodicity.

A description will now be given based on FIG. 13 of the relationship between the pattern of the pixels 2 of the liquid crystal display panel 20 and the pattern of the electroluminescent elements 150 in the present embodiment. FIG. 13 is a schematic plan view as seen from the side of the electroluminescent elements 150 of the pixel electrodes 29 when only the electroluminescent elements 150 and the pixel electrodes 29 are shown. As was stated above, the areas where the respective pixel electrodes 29 are formed are the pixels 2.

In the present embodiment, the interval of the electroluminescent elements 150 is set so as not to be identical with the interval of the pixels 2 of the liquid crystal display panel 20. In addition, the direction in which the rows of electroluminescent elements 150 extend is set so as not to be parallel to the direction in which the pixels 2 of the liquid crystal display panel 20 are aligned.

As is shown in FIG. 13, the pixels 2 of the liquid crystal display panel 20 are aligned in the horizontal direction L1 in the drawing and in the vertical direction L2 in the drawing such that as a whole they are arranged in a matrix pattern. In contrast to this, the electroluminescent elements 150 are arranged in a square lattice pattern and, as is shown in FIG. 13, the electroluminescent elements 150 extend in two directions. In addition, in the present embodiment, each of the electroluminescent elements 150 are placed in a direction orthogonal to the directions in which the pixels 2 are aligned, that is, a direction orthogonal to the directions L1 and L2 in which the source lines 26 and the gate lines 27 extend. If the directions in which the electroluminescent elements 150 extend are taken as M1 and M2, then each of the directions M1 and M2 in which the electroluminescent elements 150 extend is set so as to not to be in parallel to the directions L1 and L2 in which the pixels 2 are arranged. In FIG. 13, the directions M1 and M2 in which the electroluminescent elements 150 extend are offset 45 degrees from the directions L1 and L2 in which the pixels 2 are arranged.

Moreover, there are also two types of interval of the pixels 2 of the liquid crystal display panel 20, that is, the interval A1 of the pixels 2 aligned in the direction L1 and the interval A2 of the pixels 2 aligned in the direction L2. In contrast to this, there are also two types of interval of the electroluminescent elements 150, that is, the interval B1 of the electroluminescent elements 150 aligned in the direction M1 and the interval B2 of the electroluminescent elements 150 aligned in the direction M2. Moreover, in the present embodiment, each of the intervals B1 and B2 of the electroluminescent elements 150 are set so as not to be identical with the intervals A1 and A2 of the pixels 2. In FIG. 13, both the intervals B1 and B2 of the electroluminescent elements 150 are set narrower than the intervals A1 and A2 of the pixels 2.

Furthermore, in order to simplify the drawing, an example is shown in which both the intervals B1 of the electroluminescent elements 150 extending in the direction M1 and the interval B2 of the electroluminescent elements 150 extending in the direction M2 have been made uniform over the entire surface of the transparent substrate 131; however, it is desirable that each of the intervals B1 and B2 of the electroluminescent elements 150 be set at random on the surface of the transparent substrate 131.

Next, a detailed description will be given based on FIG. 12 of the cross sectional structure of the electroluminescent elements 150. As is shown in FIG. 12, the electroluminescent elements 150 are constructed such that it is possible by stacking a reflective electrode 151 on top of a light emitting layer 152 which is in turn stacked on top of a transparent electrode 153 (in this order from the lower side in the drawing, i.e. the outgoing surface of the transparent substrate 131) and by supplying a current to the reflective electrode 151, which is functioning as a cathode, and to the transparent electrode 153, which is functioning as an anode, for the light emitting layer 152 to be made to emit light. The light that is emitted from the light emitting layer 152 is reflected by the reflective electrode 151 enabling light to efficiently travel towards the liquid crystal display panel 20 (i.e. the lower side of the drawing). Note that the materials used for the reflective electrode 151, the light emitting layer 152, and the transparent electrode 153 are the same as those used for the reflective electrode 51, the light emitting layer 52, and the transparent electrode 53 of the first embodiment.

Note that because the reflective electrode 51 formed from aluminum, silver, silver alloy, or the like is opaque it is not possible to view the locations where the electroluminescent elements 50 are formed. Accordingly, as is shown in FIGS. 10 and 13, although it is necessary to arrange the electroluminescent elements 50 in a pattern only in parts relative to the surface on the viewing side of the liquid crystal display panel 20, by performing the illumination using the reflection from the reflective elements 151, as is shown in FIG. 11, it is possible to travel light not only to just under the electroluminescent elements 150, but also to the periphery thereof so that it is possible to illuminate the entire surface of the liquid crystal display panel 20.

However, it is desirable that the intervals B1 and B2 of the electroluminescent elements 150 be set in the manner described below.

That is, if the distance between one electroluminescent element 150 and a pixel electrode 29, which is the reflective layer of the liquid crystal display panel 20, is set, for example, to 1.3 mm, then the range in which the illuminance is 50% or more is approximately 0.7 mm from the electroluminescent element 150. Because the illumination surface area may be considered to be proportional to the square of the distance between the single electroluminescent element 150 and the pixel electrode 29 of the liquid crystal display panel 20, it is desirable that the intervals B1 and B2 be set to less than 830 times the square of the distance between the single electroluminescent element 150 and the pixel electrode 29 of the liquid crystal display panel 20. By employing such a structure, it is possible to obtain the illuminance of 50% or more across the entire surface of the transparent substrate 131 when the illuminance just under the electroluminescent element 150 is 100%, and to prevent the visibility of the display becoming partially reduced.

Moreover, because it is not possible to view the locations where the electroluminescent elements 150 are formed, if the area of the surface where the electroluminescent elements 150 are formed becomes larger than a certain size, the visibility of the liquid crystal display panel 20 deteriorates. Thus, it is desirable that the ratio of the area formed by the electroluminescent elements 150 to the area of the transparent substrate 131 be less than 0.5. By employing this setting, the display can be viewed.

Note that, in the present embodiment, a description has been given only of when the reflective electrode 151, the light emitting layer 152, and the transparent electrode 153 have all been formed in the same pattern corresponding to the pattern of the electroluminescent element 150; however, the present invention is not limited to this. Because only the portions of the reflective electrode 151, the light emitting layer 152, and the transparent electrode 153 that are formed in stacked form the electroluminescent element 150, it is sufficient if just the reflective element 151 at least is formed in the pattern of the electroluminescent elements 150.

Figure 14A:
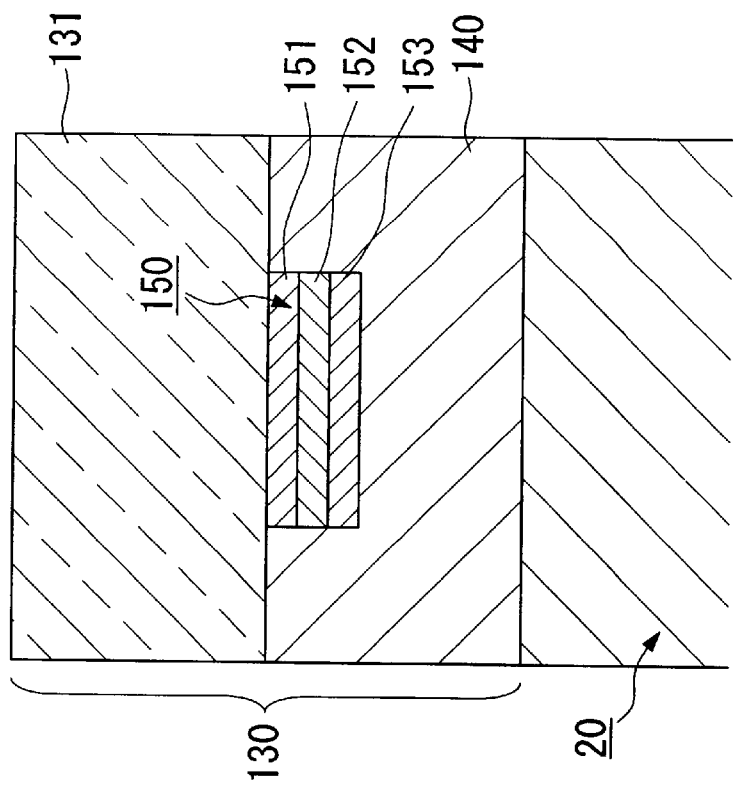
FIG. 14A is a partial schematic cross sectional view showing another example of the structure of the electroluminescent element in the third embodiment of the present invention.

Thus, for example, as is shown in FIG. 14A, it is sufficient if only the reflective electrode 151 is formed in the pattern and if the light emitting layer 152 and the transparent electrode 153 are formed over the entire surface of the transparent substrate 131. If only the reflective electrode 151 is formed in the pattern and the light emitting layer 152 and the transparent electrode 153 are formed over the entire surface of the transparent substrate 131 in this way, then only the reflective electrode 151 needs to be patterned, which, compared to when the reflective electrode 151, the light emitting layer 152, and the transparent electrode 153 are all patterned, as in the present embodiment, enables the procedure to create the electroluminescent elements 150 to be simplified. However, as is shown in FIG. 14A, when the light emitting layer 152 and the transparent electrode 153 are formed over the entire surface of the transparent substrate 131, the light transmittance is reduced by the presence of the light emitting layer 152 and the transparent electrode 153 leading to the possibility of the visibility of the display by the liquid crystal display panel 20 being reduced.

Furthermore, in the illumination device 130 of the present embodiment, a structure is employed in which the transparent substrate 131 is formed on the liquid crystal display panel 20 side and the protective layer 140 is formed on the viewer's side, while the electroluminescent elements 150 are provided on the surface of the transparent substrate 131 that is on the opposite side to the outgoing surface; however, the present invention is not limited to this.

Figure 14B:
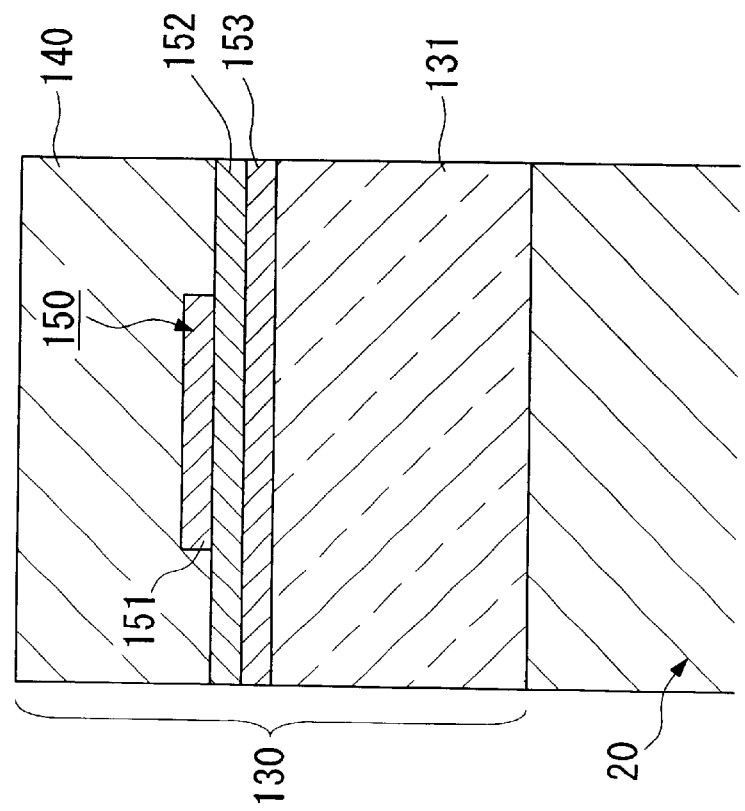
FIG. 14B is a partial schematic cross sectional view showing another example of the layout of the transparent substrate and the electroluminescent element.

As is shown in FIG. 14B, it is also possible to employ a structure in which the protective layer 140 is formed on the liquid crystal display panel 20 side and the transparent substrate 131 is formed on the viewer's side, while the electroluminescent elements 150 are provided on the outgoing surface of the transparent substrate 131 (i.e. the lower side surface in the drawing). In this case, the electroluminescent elements 150 may be formed by stacking in the pattern from the upper side in the drawing the reflective electrode 151, the light emitting layer 152, and the transparent electrode 153 in layers in that order on the surface of the transparent substrate 131 on the outgoing surface. Thus, in the same way as when the transparent substrate 131 is formed on the liquid crystal display panel 20 side and the protective layer 140 is formed on the viewer's side, while the electroluminescent elements 150 are provided on the surface of the transparent substrate 131 that is on the opposite side to the outgoing surface, the light that is emitted by the light emitting layer 152 is reflected by the reflective electrode 151, and it is possible to travel light with a high degree of efficiency towards the liquid crystal display panel 20 (i.e. the lower side in the drawing).

According to the illumination device 130 of the present embodiment, by employing a structure in which the light emitted from the light emitting layer 152 of the electroluminescent element 150 is reflected by the reflective electrode 151 so as to travel from the opposite side to the reflective electrode 151, it is possible to reduce the amount of light leaked from the illumination device 130 that travels directly towards the viewer but does not travel towards the liquid crystal display panel 20 and to travel light more efficiently towards the liquid crystal display panel 20. As a result, the illumination efficiency is improved, and it is therefore possible to reduce power consumption.

Moreover, in the illumination device 130 of the present embodiment, it is desirable that the light emitting layer 152 of the electroluminescent element 150 consist of an organic electroluminescent material. By thus forming the light emitting layer 152 from an organic electroluminescent material that is capable of light emissions at low voltages and that has a high level brightness, it is possible to reduce power consumption and to improve the illumination efficiency.

Furthermore, in the illumination device 130 of the present embodiment, by employing a structure in which the intervals B1 and B2 of the electroluminescent elements 150 are set so as not to be identical with the intervals A1 and A2 of the pixels 2 of the liquid crystal display panels 20, and in which the directions M1 and M2 in which the electroluminescent elements 150 extend are set so as not to be parallel to the directions L1 and L2 in which the pixels 2 of the liquid crystal display panels 20 are arranged, it is possible to prevent long wavelength moiré stripes from being generated and to make the moiré stripes invisible.

Note that, in the present embodiment, a description is given only of when the intervals B1 and B2 of the electroluminescent elements 150 are set so as not to be identical with the intervals A1 and A2 of the pixels 2 of the liquid crystal display panels 20, and also of when the directions M1 and M2 in which the electroluminescent elements 150 extend are set so as not to be parallel to the directions L1 and L2 in which the pixels 2 of the liquid crystal display panels 20 are aligned; however, the present invention is not limited to this.

It is sufficient if at least one of the relationship between the intervals B1 and B2 of the electroluminescent elements 150 and the intervals A1 and A2 of the pixels 2 of the liquid crystal diodes 20 and the relationship between the directions M1 and M2 in which the electroluminescent elements 150 extend and the directions L1 and L2 in which the pixels 2 of the liquid crystal display panels 20 are aligned is regulated as is described above. By employing this structure, it is possible to prevent long wavelength moiré stripes from being generated and to make the moiré stripes invisible However, because it is possible to make moiré stripes invisible, it is desirable that the intervals B1 and B2 of the electroluminescent elements 150 be set so as not to be identical with the intervals A1 and A2 of the pixels 2 of the liquid crystal display panels 20, and also that the directions M1 and M2 in which the electroluminescent elements 150 extend are set so as not to be parallel to the directions L1 and L2 in which the pixels 2 of the liquid crystal display panels 20 are aligned.

Moreover, in the present embodiment, the description given is only of when the electroluminescent elements 150 are formed in a square lattice pattern; however, the present invention is not limited to this and provided the electroluminescent elements 150 are formed having a planar structure, the present invention can be applied to when electroluminescent elements 150 are formed in any pattern.

That is, when the electroluminescent elements 150 are formed periodically in a configuration other than a lattice, such as a point form or Peano curve line, then it is sufficient if the interval of the electroluminescent elements 150 is not identical to the interval of the pixels 2 of the liquid crystal display panel 20.

In addition, any of the following structures may be employed when the electroluminescent elements 150 are formed periodically in a straight line. That is, a structure in which the intervals of the electroluminescent elements 150 are set so as not to be identical to the intervals of the pixels 2 of the liquid crystal display panel 20; a structure in which the directions in which the electroluminescent elements 150 extend are set so as not to be parallel to the directions in which the pixels 2 of the liquid crystal display panels 20 are aligned; and a structure in which both the interval of the electroluminescent elements 150 is set so as not to be identical to the interval of the pixels 2 of the liquid crystal display panel 20 and the directions in which the electroluminescent elements 150 extend are set so as not to be parallel to the directions in which the pixels 2 of the liquid crystal display panels 20 are aligned.

A description will now be given of examples of patterns of the electroluminescent elements 150 other than those described in the above embodiments when the electroluminescent elements 150 are formed periodically in a straight line configuration.

Figure 15B:
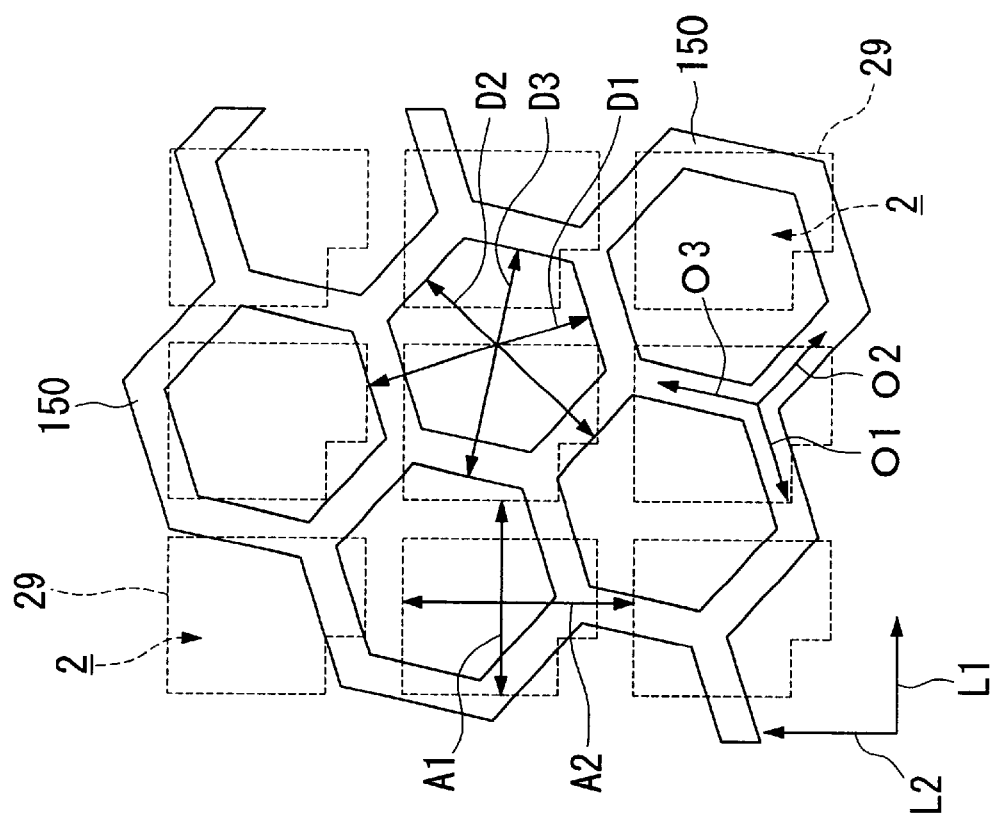
FIGS. 15A and 15B are schematic plan views showing other examples of patterns of the electroluminescent element in the third embodiment of the present invention.
Figure 15A:
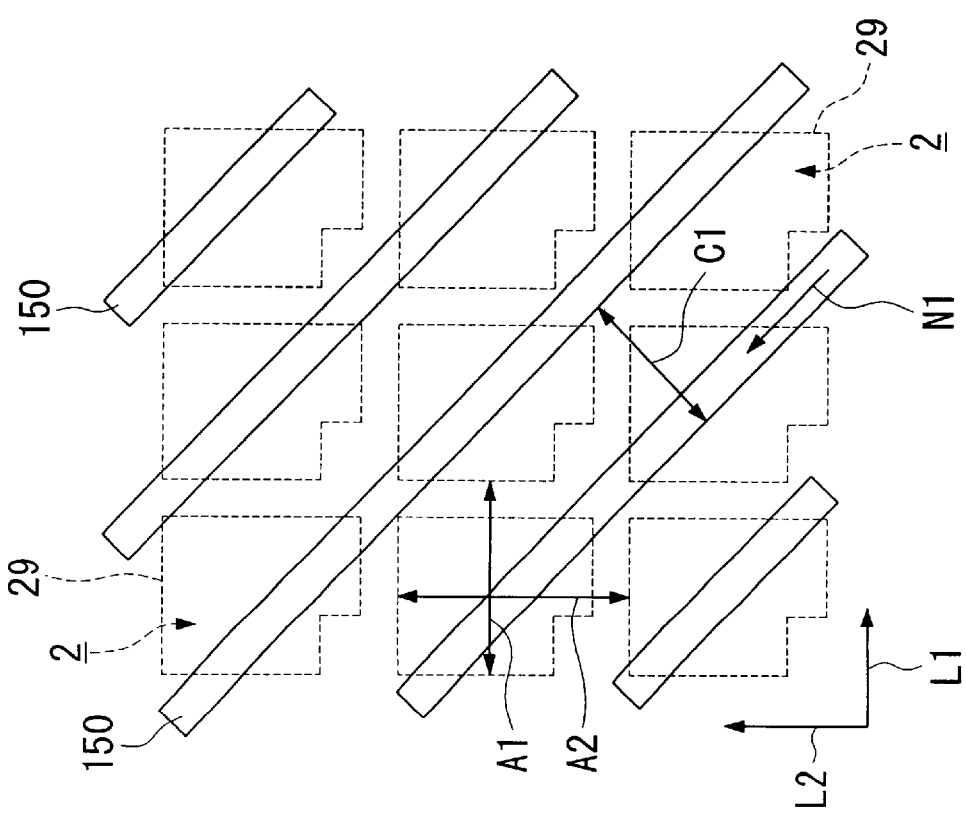

As is shown in FIG. 15A, it is also possible for the electroluminescent elements 150 to be formed in a striped configuration. The direction in which the electroluminescent elements 150 extend in this case is solely the direction N1, while the interval between the electroluminescent elements 150 is solely the interval C1.

If the electroluminescent elements 150 are formed in a striped configuration in this way, then any of the following structures may be employed. That is, a structure in which the interval C1 of the electroluminescent elements 150 is set so as not to be identical to the intervals A1 and A2 of the pixels 2 of the liquid crystal display panel 20; a structure in which the direction N1 in which the electroluminescent elements 150 extend is set so as not to be parallel to the directions L1 and L2 in which the pixels 2 of the liquid crystal display panels 20 are aligned; and a structure in which both the interval C1 of the electroluminescent elements 150 is set so as not to be identical to the intervals A1 and A2 of the pixels 2 of the liquid crystal display panel 20 and the direction N1 in which the electroluminescent elements 150 extend is set so as not to be parallel to the directions L1 and L2 in which the pixels 2 of the liquid crystal display panels 20 are aligned.

Note that, in FIG. 15A, an example is shown in which both the interval C1 of the electroluminescent elements 150 is set so as not to be identical to the intervals A1 and A2 of the pixels 2 of the liquid crystal display panel 20 and the direction N1 in which the electroluminescent elements 150 extend is set so as not to be parallel to the directions L1 and L2 in which the pixels 2 of the liquid crystal display panels 20 are aligned.

Furthermore, as is shown in FIG. 15B, it is also possible for the electroluminescent elements 150 to be formed in a hexagonal lattice configuration. There are three different directions, i.e. O1, O2, and O3, in which the electroluminescent elements 150 extend in this case, and also three different intervals for the electroluminescent elements 150, that is, the interval D1 of the electroluminescent elements 150 extending in the direction O1, the interval D2 of the electroluminescent elements 150 extending in the direction O2, and the interval D3 of the electroluminescent elements 150 extending in the direction O3.

If the electroluminescent elements 150 are formed in a hexagonal lattice configuration in this way, then any of the following structures may be employed. That is, a structure in which the intervals D1, D2, and D3 of the electroluminescent elements 150 are set so as not to be identical to the intervals A1 and A2 of the pixels 2 of the liquid crystal display panel 20; a structure in which the directions O1, O2, and O3 in which the electroluminescent elements 150 extend are set so as not to be parallel to the directions L1 and L2 in which the pixels 2 of the liquid crystal display panels 20 are aligned; and a structure in which both the intervals D1, D2, and D3 of the electroluminescent elements 150 are set so as not to be identical to the intervals A1 and A2 of the pixels 2 of the liquid crystal display panel 20 and the directions O1, O2, and O3 in which the electroluminescent elements 150 extend are set so as not to be parallel to the directions L1 and L2 in which the pixels 2 of the liquid crystal display panels 20 are aligned.

Note that, in FIG. 15B, an example is shown in which both the intervals D1, D2, and D3 of the electroluminescent elements 150 are set so as not to be identical to the intervals A1 and A2 of the pixels 2 of the liquid crystal display panel 20 and the directions O1, O2, and O3 in which the electroluminescent elements 150 extend are set so as not to be parallel to the directions L1 and L2 in which the pixels 2 of the liquid crystal display panels 20 are aligned.

Note that, in FIGS. 13, 15A, and 15B, the electroluminescent elements 150 are formed in the square lattice pattern, the striped pattern, and the hexagonal lattice pattern without any gaps between the electroluminescent elements; however, the present invention is not limited to this, and it is also possible to employ a structure in which the electroluminescent elements 150 are segmented into a plurality of electroluminescent elements arranged with a gap in between such that they form as a whole a configuration having periodicity such as a lattice configuration.

Note that the technical idea of the present embodiment can apply to the aforementioned first and second embodiments.

Note that, in each of the above embodiments, a description is given only of when the electroluminescent elements are formed from a reflective electrode, a light emitting layer, and a transparent electrode; however, the present invention is not limited to this and a variety of structures may be employed provided that in each structure the electroluminescent element is provided with at least a transparent electrode, a light emitting layer, and a reflective electrode, in that order, from the outgoing surface.

Moreover, in each of the above embodiments, a description is given using as an example an active matrix type of reflective liquid crystal display device (electro-optical device) equipped with a TFT element; however, the illumination device of the present invention may be provided in a display device having any type of structure. By providing the illumination device of the present invention in the viewing side of a display device, it is possible to reduce the amount of light leaked from the illumination device that directly travels towards the viewer but does not travel towards the display device and to improve the illumination efficiency, and it is therefore possible to provide a display device with high contrast ratio and excellent display quality and that reduces power consumption. In addition, by employing the structure described in the third embodiment, moiré stripes can be invisible.

Furthermore, the illumination device according to each of the above embodiments may be used independently and may also be used for illuminating any type of illuminated body.

Note that light emitting elements according to each embodiment includes at least organic electroluminescent elements, inorganic electroluminescent elements, organic LEDs, and inorganic LEDs.

Electronic Instrument

Next, a description will be given of a specific example of an electronic instrument provided with any of the liquid crystal display devices (electro-optical devices) 10, 70, and 110 of each of the above embodiments.

Figure 16A:
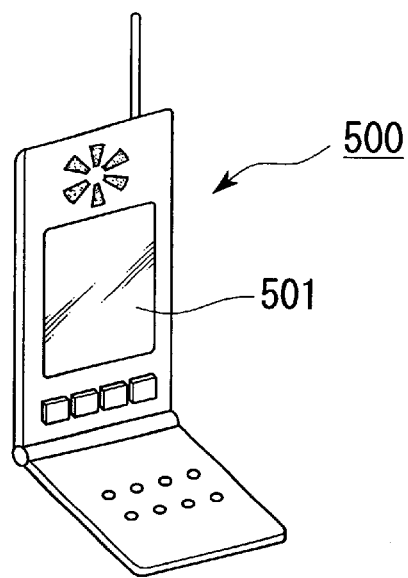
FIG. 16A is a view showing an example of a portable telephone provided with the liquid crystal display device (electro-optical device) of each of the above embodiments.

FIG. 16A is a perspective view showing an example of a portable telephone. In FIG. 16A, the number 500 indicates the body of the portable telephone and the number 501 indicates a liquid crystal display section that is provided with any of the above described liquid crystal display devices 10, 70, or 110.

Figure 16B:
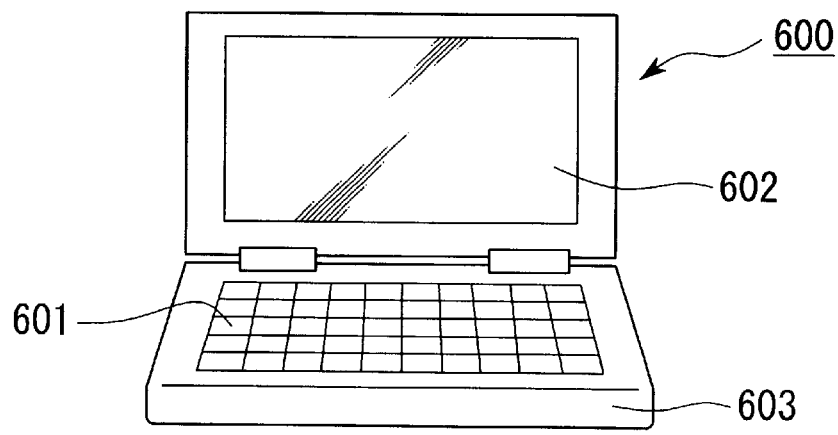
FIG. 16B is a view showing an example of a portable information processing device provided with the liquid crystal display device (electro-optical device) of each of the above embodiments.

FIG. 16B is a perspective view showing an example of a portable information processing device such as a word processor or personal computer. In FIG. 16B, the number 600 indicates the information processing device; 601 indicates an input section such as a keyboard, 603 indicates the body of the information processing device; and 602 indicates a liquid crystal display section that is provided with any of the above described liquid crystal display devices 10, 70, or 110.

Figure 16C:
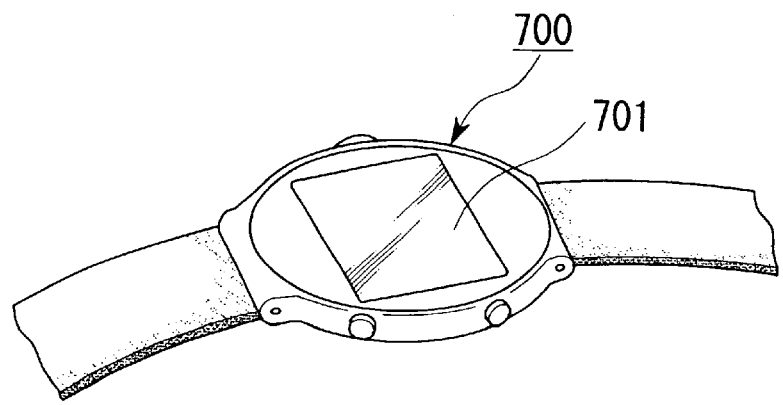
FIG. 16C is a view showing an example of an electronic instrument in the form of a wristwatch provided with the liquid crystal display device (electro-optical device) of each of the above embodiments.

FIG. 16C is a perspective view showing an example of a wristwatch type of electronic instrument. In FIG. 16C, the number 700 indicates the body of the watch and the number 701 indicates a liquid crystal display section that is provided with any of the above described liquid crystal display devices 10, 70, or 110.

Because the electronic instruments shown in FIGS. 16A to 16C are provided with one of the liquid crystal display devices of the above embodiments, they provide excellent display quality and reduce power consumption.

What is claimed is:

1. An illumination device comprising:
    a transparent substrate having light emitting elements which are disposed on a surface thereof and which emit light,
    wherein the light emitting elements are provided with at least a transparent electrode, a light emitting layer, and a reflective electrode in order from the outgoing surface of the transparent substrate, and
    wherein concavities are formed in a pattern on the surface of the transparent substrate, and at least the reflective electrode of each light emitting element is formed in the concavities.

2. The illumination device according to claim 1, wherein at least the reflective electrode and the light emitting layer of each light emitting element are formed in the concavities.

3. The illumination device according to claim 1, wherein the light emitting layer consists of an organic electroluminescent material.

4. The illumination device according to claim 1, wherein: the concavities are formed on a surface of the transparent substrate on the outgoing surface; the concavities have a concave curved bottom; and at least the reflective electrode of each light emitting element is formed on the concave curved bottom of the concavities.

5. The illumination device according to claim 1, wherein a protective layer is provided on the surface of the transparent substrate on which the concavities are formed.

6. The illumination device according to claim 1, wherein the surface in which the concavities are formed is flattened by filler.

7. The illumination device according to claim 1, wherein the light emitting layer is covered by the transparent substrate, the reflective electrode and the transparent electrode.

8. The illumination device according to claim 1, wherein the vertical cross section of the concavities is a rectangular shape and the light emitting elements are formed on a bottom of the concavities.

9. The illumination device according to claim 1, wherein the concavities are formed on a surface of the transparent substrate on the opposite side to the outgoing surface.

10. The illumination device according to claim 1, wherein the light emitted by the light emitting elements is emitted from an opening side of each of the concavities.

11. The illumination device according to claim 1, wherein the light emitted by the light emitting elements is emitted from a side opposite to an opening side of each of the concavities.

12. A display device provided with the illumination device according to claim 1.

13. The display device according to claim 12, wherein the display device is an electro-optical device.

14. An electronic instrument provided with the display device described in claim 12.

15. A method for manufacturing the illumination device according to claim 1, wherein, after the concavities have been formed on the surface of the transparent substrate with a pattern, at least the reflective electrode of the light emitting elements is formed in the concavities on the transparent substrate.

16. The method for manufacturing the illumination device according to claim 15, wherein the concavities having a concave curved bottom are formed on one surface of the transparent substrate by isotropically etching after forming the resist in the pattern.

17. The method for manufacturing the illumination device according to claim 15, wherein the light emitting elements have a layer structure of the reflective electrode, the light emitting layer, and the transparent electrode sequentially formed in the concavities on the surface of the transparent substrate.

18. The method for manufacturing the illumination device according to claim 15, wherein the concavities having a flat bottom are formed on one surface of the transparent substrate by anisotropically etching after forming the resist in the pattern.

19. The method for manufacturing the illumination device according to claim 15, wherein the light emitting elements have a layer structure of the transparent electrode, the light emitting layer, and the reflective electrode sequentially formed in the concavities on the surface of the transparent substrate.

20. An illumination device comprising:
a transparent substrate having light emitting elements which are disposed on a surface thereof,
wherein the illumination device emits light towards a display device which includes an array of pixels,
wherein the light emitting elements are provided with at least a transparent electrode, a light emitting layer, and a reflective electrode in order from the outgoing surface of the transparent substrate, and
wherein the light emitting elements are arranged in lines and a first interval between the adjacent lines is different from a second interval between adjacent ones of the pixels.

21. The illumination device according to claim 20, wherein the light emitting elements are formed in a lattice configuration in a pattern on one surface of the transparent substrate, and a first in which the light emitting elements extend are not parallel to a second in which the pixels of the display device are aligned.

22. The illumination device according to claim 20, wherein the intervals of the light emitting elements are set randomly on the surface of the transparent substrate.

23. The illumination device according to claim 20, wherein the light emitting elements are provided in any of a striped configuration, a square lattice configuration, and a hexagonal lattice configuration.

24. The illumination device according to claim 20, wherein the display device is provided with a reflective layer; and the intervals of the light emitting elements are less 830 times the square of the distance between the light emitting element and the reflective layer of the display device.

25. The illumination device according to claim 20, wherein a ratio between an area formed by the light emitting elements and an area of the transparent substrate is less than 0.5.

26. The illumination device according to claim 20, wherein the light emitting layer consists of organic electroluminescent material.

27. The illumination device according to claim 20, wherein the intervals between the adjacent lines and the intervals between the adjacent pixels are appropriately set in order to prevent generation of long wavelength moire stripes.

28. A display device comprising:
a liquid crystal panel including a plurality of pixels; and
an illumination device that emits light towards a viewing side of the liquid crystal panel,
wherein the illumination device, includes:
a plurality of light emitting elements; and
a transparent substrate that has an outgoing surface, light from the light emitting elements passing through the transparent substrate and being emitted from the outgoing surface, and the light emitting elements being arranged to be opposite to the outgoing surface.

29. The display device according to claim 28, wherein the light emitting elements are arranged in lines and a first interval between the adjacent lines is different from a second interval between adjacent ones of the pixels.

30. The display device according to claim 28, wherein the light emitting elements are formed in a lattice configuration in a pattern on one surface of the transparent substrate, and a first direction in which the light emitting element extends is not parallel to a second direction in which the pixels are aligned.

31. The display device according to claim 28, wherein intervals of the light emitting elements are set randomly on a surface of the transparent substrate.

32. The display device according to claim 28, wherein the light emitting elements are provided in any of a striped configuration, a square lattice configuration, and a hexagonal lattice configuration.

33. The display device according to claim 28, further comprising a reflective layer;
wherein intervals of the light emitting elements are less than 830 times the square of the distance between the light emitting elements and the reflective layer.

34. The display device according to claim 28, wherein a ratio of an area formed by the light emitting elements to an area of the transparent substrate is less than 0.5.

35. An illumination device comprising:
a light emitting element formed in a lattice configuration in a pattern on one surface of a transparent substrate,
wherein the illumination device emits light towards a display device which includes an array of pixels,
wherein the light emitting element is provided with at least a transparent electrode, a light emitting layer, and a reflective electrode in order from the outgoing surface of the transparent substrate, and
wherein the light emitting element is linearly arranged, and a first direction in which the light emitting element extends is not parallel to a second direction in which the pixels of the display device are aligned.

36. An illumination device comprising:

a transparent substrate having light emitting elements which are disposed on a surface thereof and which emit light, wherein the light emitting elements are provided with at least a transparent electrode, a light emitting layer, and a reflective electrode in order from the outgoing surface of the transparent substrate.

* * * * *